United States Patent
Sonobe et al.

(10) Patent No.: US 8,548,023 B2
(45) Date of Patent: Oct. 1, 2013

(54) SEMICONDUCTOR LASER ELEMENT

(75) Inventors: Shinya Sonobe, Anan (JP); Shingo Masui, Anan (JP)

(73) Assignee: Nichia Corporation, Anan-shi (JP)

( * ) Notice: Subject to any disclaimer, the term of this patent is extended or adjusted under 35 U.S.C. 154(b) by 35 days.

(21) Appl. No.: 12/742,075

(22) PCT Filed: Oct. 31, 2008

(86) PCT No.: PCT/JP2008/069914
§ 371 (c)(1),
(2), (4) Date: May 7, 2010

(87) PCT Pub. No.: WO2009/060802
PCT Pub. Date: May 14, 2009

(65) Prior Publication Data
US 2010/0278207 A1  Nov. 4, 2010

(30) Foreign Application Priority Data

Nov. 8, 2007 (JP) ................................. 2007-290590
Aug. 6, 2008 (JP) ................................. 2008-203019

(51) Int. Cl.
*H01S 5/16* (2006.01)
*H01S 5/20* (2006.01)
*H01S 5/24* (2006.01)

(52) U.S. Cl.
USPC .................. 372/46.01; 372/46.012; 372/103; 372/11

(58) Field of Classification Search
USPC ............................. 372/46.01, 103, 11, 46.012
See application file for complete search history.

(56) References Cited

U.S. PATENT DOCUMENTS

| 5,070,509 A * | 12/1991 | Meyers ....................... 372/45.01 |
| 6,373,875 B1 | 4/2002 | Yu et al. |
| 2002/0015428 A1* | 2/2002 | Fukunaga ....................... 372/46 |
| 2002/0159492 A1* | 10/2002 | Yamamura et al. .............. 372/46 |
| 2004/0184497 A1 | 9/2004 | Kneissl et al. |
| 2005/0030998 A1* | 2/2005 | Schmidt et al. .................. 372/46 |
| 2005/0232314 A1 | 10/2005 | Hashimoto |
| 2005/0279994 A1 | 12/2005 | Ueda et al. |
| 2005/0281304 A1* | 12/2005 | Mochida ..................... 372/46.01 |
| 2007/0098030 A1* | 5/2007 | Ha et al. ..................... 372/43.01 |
| 2008/0008220 A1 | 1/2008 | Ueda et al. |

FOREIGN PATENT DOCUMENTS

| JP | 02-058288 A | 2/1990 |
| JP | 2000-068593 A | 3/2000 |
| JP | 2002-164617 A | 6/2002 |
| JP | 2003-264335 A | 9/2003 |

(Continued)

OTHER PUBLICATIONS

Extended European Search Report of the corresponding European Application No. 08847356.6, dated Apr. 18, 2013.

*Primary Examiner* — Jessica Stultz
*Assistant Examiner* — Michael Carter
(74) *Attorney, Agent, or Firm* — Global IP Counselors, LLP

(57) ABSTRACT

A semiconductor laser element includes a laminate composed of a first conductivity type semiconductor layer, an active layer, and a second conductivity type semiconductor layer; and a second embedded layer that is in contact with the second conductivity type semiconductor layer, has a stripe-like groove parallel to the cavity direction, and is composed of an insulator, the groove is embedded with a first embedded layer composed of a dielectric on the cavity end face side, and with a conductive layer on the inside.

26 Claims, 13 Drawing Sheets

(56) References Cited

FOREIGN PATENT DOCUMENTS

| | | |
|---|---|---|
| JP | 2003-332244 A | 11/2003 |
| JP | 2004-146527 A | 5/2004 |
| JP | 2004-158500 A | 6/2004 |
| JP | 2004-289157 A | 10/2004 |
| JP | 2005-175056 A | 6/2005 |
| JP | 2006-041491 A | 2/2006 |
| JP | 2007-129236 A | 5/2007 |
| JP | 2007-184644 A | 7/2007 |

* cited by examiner

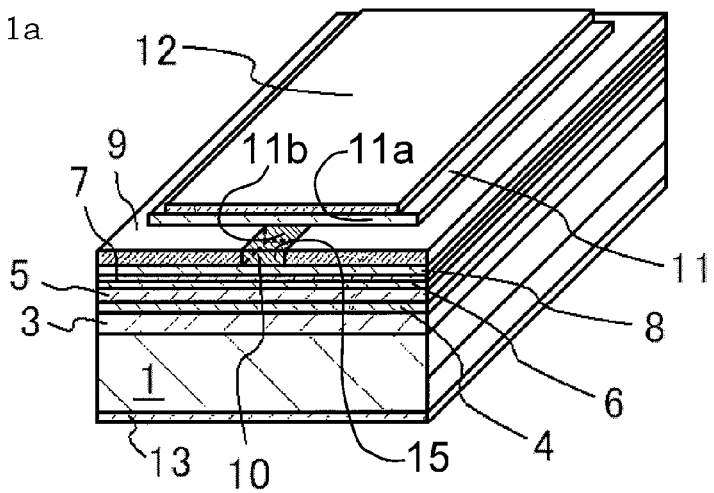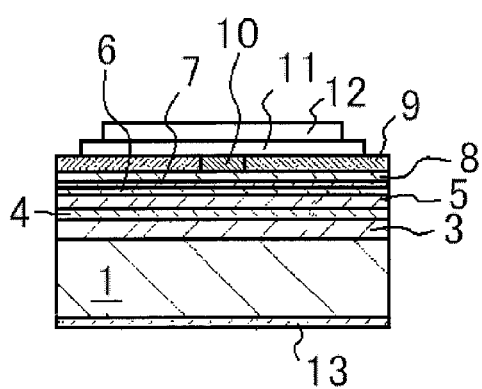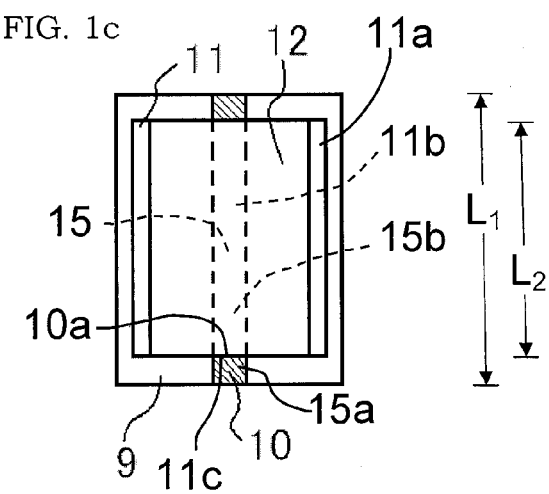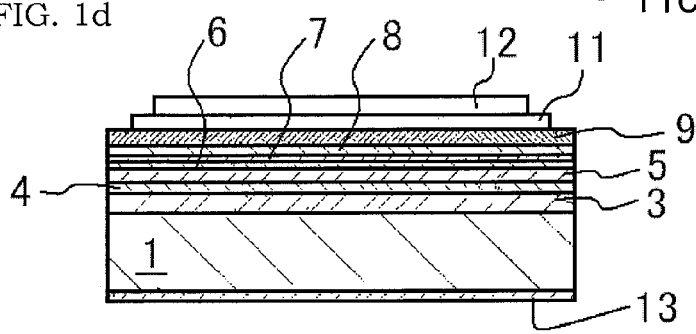

FIG. 4a
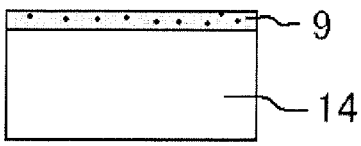
FIG. 4b
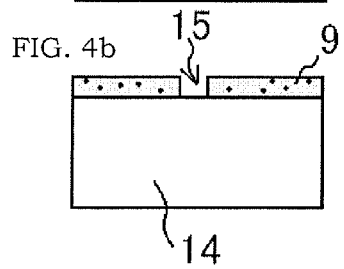
FIG. 4b'
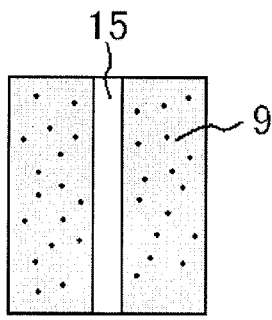
FIG. 4c
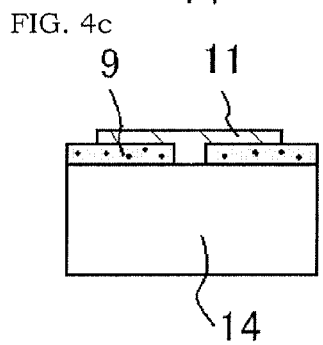
FIG. 4c'
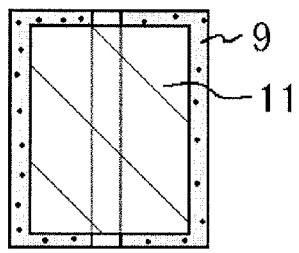
FIG. 4d'
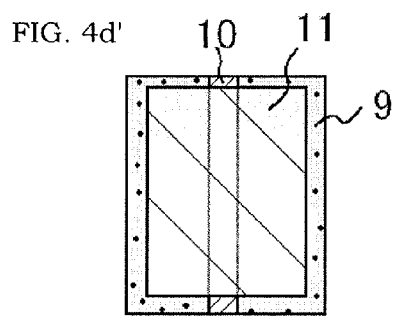
FIG. 4d"
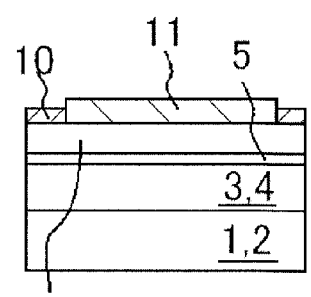
FIG. 4e'
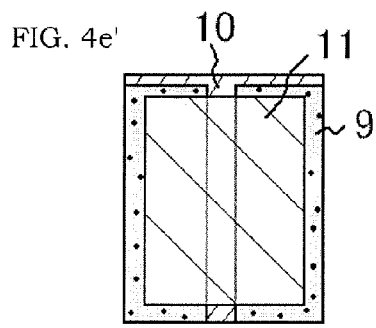
FIG. 4e"
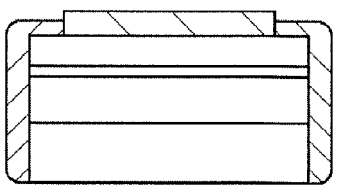

SEMICONDUCTOR LASER ELEMENT

CROSS-REFERENCE TO RELATED APPLICATIONS

This national phase application claims priority to Japanese Patent Application No. 2007-290590 filed on Nov. 8, 2007 and Japanese Patent Application No. 2008-203019 filed on Aug. 6, 2008. The entire disclosures of Japanese Patent Application Nos. 2007-290590 and 2008-203019 are hereby incorporated herein by reference.

TECHNICAL FIELD

The present invention relates to a semiconductor laser element, and more particularly relates to a semiconductor laser element having a structure for confining light with a current blocking layer.

BACKGROUND ART

With blue-violet semiconductor lasers composed of a compound semiconductor, for example, $In_xAl_yGa_{1-x-y}N$ ($0 \leq x$, $0 \leq y$, $0 \leq x+y \leq 1$), in the past, a method in which the aluminum content of a clad layer is increased has been studied in an effort to sufficiently increase the confinement coefficient of light in the vertical direction at the active layer. However, if the aluminum content is raised, lattice mismatching with the substrate and other compound semiconductor layers results in internal strain in the aluminum-containing layer, which leads to cracking and other such problems.

To deal with this, a semiconductor laser element has been proposed in which a transparent electrode or a metal layer that functions as a clad layer and a current blocking layer having a stripe-like groove are disposed over the active layer, which shortens the time it takes to grow the compound semiconductor layer, makes the compound semiconductor layer into a thin film, and reduces cracking within the aluminum-containing layer (for example, Japanese Laid-Open Patent Application Publication Nos. 2006-41491-A and 2007-129236-A).

SUMMARY

With this semiconductor laser element, the cleavage and orientation properties are designed to improve because the transparent electrode, etc., formed on the current blocking layer reach to the cavity end face, but producing a cavity end face by cleavage involving a transparent electrode is difficult.

When this transparent electrode sends current to the cavity end face, heat is generated near the cavity end face, and this heat is particularly pronounced with high-output elements, so there is concern over a drop in the COD level.

If the transparent electrode is formed farther away from the cavity end face to improve cavity end face production and the COD level, this will affect the light confinement coefficient in the vertical direction near the cavity end face, so the refractive index distribution in the cavity direction will change, and the FFP (Far Field Pattern) in the vertical direction will be disturbed.

The present invention was conceived in light of the above problems, and it is an object thereof to provide a reliable and long-lasting semiconductor laser element with which heat generation near the cavity end face can be kept to a minimum even with high-output semiconductor laser elements, the COD level can be improved, and a good FFP shape can be obtained.

A semiconductor laser element of the present invention includes a laminate composed of a first conductivity type semiconductor layer, an active layer, and a second conductivity type semiconductor layer; and a second embedded layer that is in contact with the second conductivity type semiconductor layer, has a stripe-like groove parallel to the cavity direction, and is composed of an insulator, the groove is embedded with a first embedded layer composed of a dielectric on the cavity end face side, and with a conductive layer on the inside.

Another semiconductor laser element of the invention includes a laminate composed of a first conductivity type semiconductor layer, an active layer, and a second conductivity type semiconductor layer, and equipped with a cavity; a stripe-like conductive layer provided in contact on the second conductivity type semiconductor layer; and a first embedded layer that is in contact on the second conductivity type semiconductor layer, is disposed on an extension of the conductive layer, and has a refractive index that is less than or equal to the refractive index of the conductive layer.

According to the semiconductor laser element of the present invention, it is possible to provide a reliable and long-lasting semiconductor laser element with which heat generation near the cavity end face can be kept to a minimum, the COD level can be improved, and a good FFP shape can be obtained.

BRIEF DESCRIPTION OF THE DRAWINGS

FIG. 1a is a perspective view, FIG. 1b is a front view, FIG. 1c is a plan view and FIG. 1d is a side view showing the construction of the semiconductor laser element according to the present invention.

FIGS. 4a-4c include schematic cross-sectional views, FIGS. 4b'-4e' include plan views, and FIGS. 4d'' and 4e'' include schematic cross-sectional views showing a manufacturing the semiconductor laser element according to the present invention;

DETAILED DESCRIPTION OF THE PREFERRED EMBODIMENTS

Figure 2A:
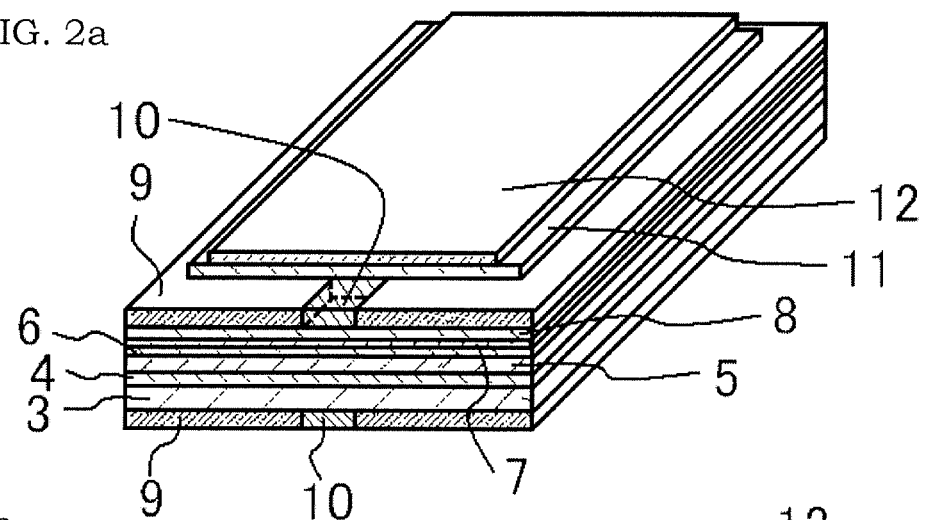
FIG. 2a is a perspective view.
Figure 2B:
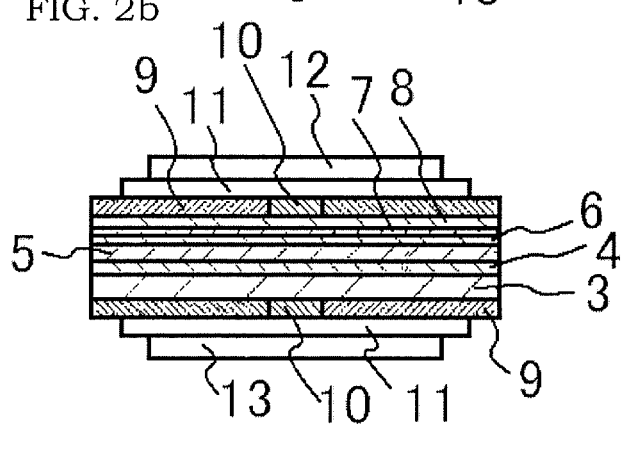
FIG. 2b is a front view.
Figure 2C:
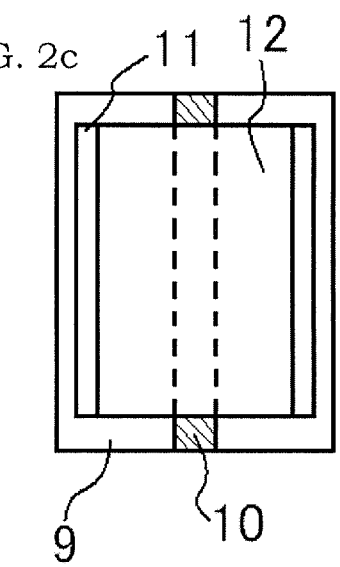
FIG. 2c is a plan view and FIG. 2d is a side view showing the construction of another semiconductor laser element according to the present invention.
Figure 2D:
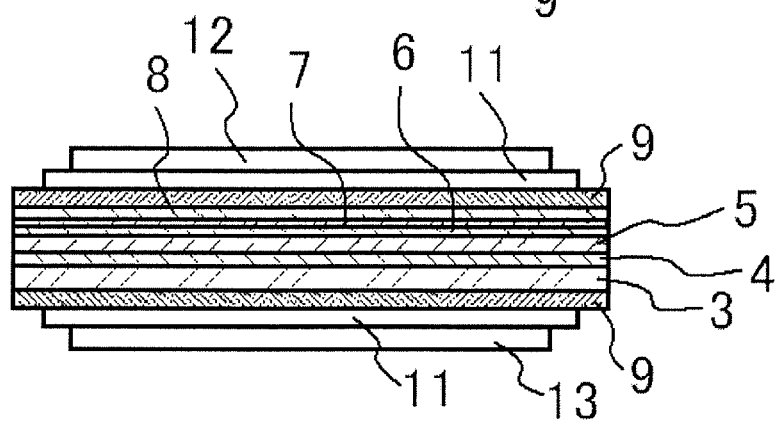

A semiconductor laser element of the present invention is composed of a laminate comprising a first conductivity type semiconductor layer, an active layer, and a second conductivity type semiconductor layer.

There is no particular restriction on the first and second conductivity type semiconductor layers, it may be a layer of a compound semiconductor, and preferably a nitride semiconductor particularly represented by a general formula of $In_xAl_yGa_{1-x-y}N$ ($0 \leq x \leq 1$, $0 \leq y \leq 1$, $0 \leq x+y \leq 1$). In addition to this, it may be used one which is partly substituted with B as a group III element, or is substituted a part of N as a group V element with P or As. As for the first conductivity type and the second conductivity type, either one is n-type and other is p-type. The n-type semiconductor layer may be doped with at least one n-type impurity of IV or VI group elements, such as Si, Ge, Sn, S, O, Ti, Zr, Cd etc. The p-type semiconductor layer may be doped with p-type impurity, such as Mg, Zn, Be, Mn, Ca, Sr etc. The doped concentration is preferably, for example, about $5 \times 10^{16}/cm^3$ to about $1 \times 10^{21}/cm^3$. All of layers in the n-type or p-type nitride semiconductor layers may not necessarily contain n-type or p-type impurity.

The first and/or second conductivity type semiconductor layer(s) preferably has a light guide layer, and more preferably has a structure which is a SCH (Separate Confinement Heterostructure) wherein light guide layers sandwich the active layer therebetween. The light guide layers of the first and second conductivity type semiconductor layers may have structures with different compositions and/or thicknesses to each other.

For example, the first conductivity type semiconductor layer (hereinafter sometimes referred to as an "n-type semiconductor layer" or "n-side semiconductor layer"), the active layer, and the second conductivity type semiconductor layer (hereinafter sometimes referred to as a "p-type semiconductor layer" or "p-side semiconductor layer") may have a single film structure, a multilayer film structure, or a superlattice structure consisting of two layers of different compositions. These layers may also have a compositional gradient layer and/or a concentration gradient layer.

The n-type semiconductor layer may have a structure consisting of two or more layers of different compositions and/or impurity concentrations.

For example, a first n-type semiconductor layer may be formed from $In_xAl_yGa_{1-x-y}N$ ($0 \leq x < 1$, $0 \leq y \leq 1$, $0 \leq x+y \leq 1$), preferably $Al_xGa_{1-x}N$ ($0 \leq x \leq 0.5$), and more preferably $Al_xGa_{1-x}N$ ($0 < x \leq 0.3$). As to the specific conditions, it is preferable to form it at a growth temperature inside the reaction furnace of 900° C. or higher. The first n-type semiconductor layer can also be made to function as a clad layer. A thickness is suitable about 0.5 to 5 μm. As will be discussed below, the first n-type semiconductor layer can be omitted if a conductive oxide film with a low refractive index is provided in the n-type semiconductor layer side.

A second n-type semiconductor layer can be made to function as a light guide layer, and may be formed from $In_xAl_yGa_{1-x-y}N$ ($0 \leq x < 1$, $0 \leq y < 1$, $0 \leq x+y \leq 1$). A thickness is suitable about 0.1 to 5 μm. The second n-type semiconductor layer can be omitted.

One or more semiconductor layers may also be additionally formed between the n-type semiconductor layers.

The active layer may have either a multiple quantum well structure or a single quantum well structure. A well layer is preferably formed from $In_xAl_yGa_{1-x-y}N$ ($0 \leq x \leq 1$, $0 \leq y < 1$, $0 \leq x+y \leq 1$) including at least indium. It can emit light in the long wave band if the indium content is raised, can emit light in the ultraviolet band if the aluminum content is raised, and can emit light in a wavelength band of about 300 to 650 nm. Particularly, it is effective in the lasing wavelength of 440 nm or more. Light emission efficiency can be enhanced by forming the active layer with a quantum well structure.

The p-type semiconductor layer is laminated on the active layer. This may have a structure consisting of two or more layers with different compositions and/or impurity concentrations.

A first p-type semiconductor layer may be formed from $Al_xGa_{1-x}N$ ($0 \leq x \leq 0.5$) containing a p-type impurity. The first p-type semiconductor layer r can be made to function as a p-side electron confining layer.

A second p-type semiconductor layer can be made to function as a light guide layer, and may be formed from $In_xAl_yGa_{1-x-y}N$ ($0 \leq x < 1$, $0 \leq y < 1$, $0 \leq x+y \leq 1$).

The first p-side semiconductor layer and the second p-side semiconductor layer can be omitted.

A superlattice layer composed of GaN and AlGaN, or $Al_xGa_{1-x}N$ ($0 \leq x \leq 0.5$) containing a p-type impurity, that functions as a clad layer, can be formed on the second p-type semiconductor layer, but this layer may also be omitted.

By omitting this layer, it is possible to reduce time spent in growing a p-side semiconductor layer after the growth of the active layer. Also, since a p-side semiconductor layer generally has low resistance, the p-side semiconductor layer may be laminated at a higher temperature than the n-side semiconductor layer or the active layer. However, if the p-side semiconductor layer is grown at a high temperature, an active layer with a high indium composition may decompose. Therefore, omitting this layer reduces any damage etc., that would otherwise be caused by growing the p-side semiconductor layer at a high temperature, to the active layer. Furthermore, since the number of laminations of the p-side semiconductor layer with high resistance is reduced, the operating voltage can be lowered.

A third p-type semiconductor layer can be formed from $Al_xGa_{1-x}N$ ($0 \leq x \leq 1$) containing a p-type impurity.

Indium may be included in these semiconductor layers. The thickness of each layer is suitable about 3 nm to 5 μm.

One or more semiconductor layers may also be additionally formed between the p-type semiconductor layers.

With a semiconductor laser of a relative long wavelength of 440 nm or greater, the aluminum composition must be raised in the clad layer on the p-side and/or the n-side in order to provide an adequate refractive index differential. Also, with a semiconductor laser that oscillates light in the ultraviolet band of 380 nm or less, the absorption of light can be prevented by forming a layer with a high aluminum composition.

However, cracking is more apt to occur in the semiconductor layer if a layer with a high aluminum composition is formed. Therefore, omitting the clad layer affords a semiconductor laser that has a long wavelength, is reliable, and has less cracking.

There is no particular restriction on a growth method of the semiconductor layer, it can be formed by means of any known method which can grow these nitride semiconductor layers, such as MOVPE (Metal Organic Vapor Phase Epitaxy), MOCVD (Metal Organic Chemical Vapor Deposition), HVPE (Hydride Vapor Phase Epitaxy), MBE (Molecular Beam Epitaxy) or the like. In particular, MOCVD is preferable because it allows to be growth with good crystallinity under reduced pressure to atmospheric pressure.

Figure 6A:
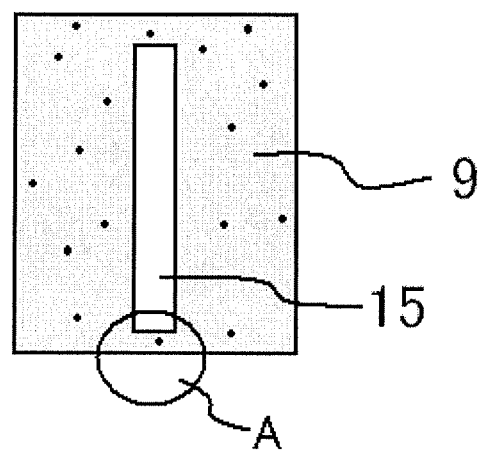
FIG. 6a and FIG. 6b are schematic cross-sectional views showing a manufacturing still another semiconductor laser element according to the present invention.

In an embodiment of the semiconductor laser element of the present invention, as shown in FIG. 1, a second embedded layer is formed in contact with the p-type semiconductor layer, that is, on the p-type semiconductor layer. The second embedded layer is usually formed from an insulator, and functions as a current blocking layer (hereinafter the second embedded layer will sometimes be referred to as a current blocking layer). It is usually preferable for the second embedded layer to be formed as a layer parallel to the active layer. The second embedded layer has a stripe-like groove, and extends parallel to the cavity direction. The groove may end to the inside of the cavity end face, but preferably it is open all the way to the cavity end face. As shown in FIG. 6*a*, however, if the second embedded layer is formed from the same material as a first embedded layer (discussed below), it does not necessarily need to have an open end, and part of the second embedded layer may be disposed as the first embedded layer on an extension of the groove up to the cavity end face and the part of the second embedded layer near the cavity end face (A in FIG. 6).

The width of the groove is, for example, about 0.3 to 50 μm, and when a single mode laser is produced, about 1 to 5 μm is preferable. The end face of the second embedded layer in the cavity direction need not necessarily coincide with the cavity end face exactly, but it preferably coincides. The end face of the second embedded layer other than in the cavity direction may coincide with the end face of the laminate, but is preferably disposed to the inside of the laminate end face. The bottom of the groove in the second embedded layer is in contact with the semiconductor layer. That is, the depth of this groove corresponds to the thickness of the second embedded layer.

It is good for the second embedded layer to have a refractive index a that is less than that of the semiconductor layers (for example, about 2.5 of refractive index of GaN), and particularly the active layer (for example, about 2.1 to 3.5 of refractive index of InAlGaN) and the conductive layer (discussed below). Having such refractive index ensures to allow light to be confined within the waveguide.

Alternatively, it is good for this layer to be composed of a material having a barrier of at least the drive voltage of the semiconductor laser element. The phrase "having a barrier of at least the drive voltage" here means that the insulation of the semiconductor can be maintained. Having a barrier such as this would afford a semiconductor laser that exhibits stable, good electrical characteristics and has a longer operating life.

The second embedded layer may be formed from an insulating material selected from the group comprising an oxide or a nitride, such as, $SiO_2$ (about 1.5 of refractive index), $Ga_2O_3$, $Al_2O_3$, $ZrO_2$, SiN, AlN and AlGaN, and an i-type semiconductor layer. There are no particular restrictions on the thickness, it can be about 0.05 to 5 μm. The second embedded layer may be a single layer of a multiple layer.

Also, the second embedded layer may be formed the same as above, in contact with the n-type semiconductor layer instead of with the p-type semiconductor layer, or in contact with both the p-type semiconductor layer and the n-type semiconductor layer. In this case, the groove, the first embedded layer, and the conductive layer (discussed below) are usually formed in the same way.

In this Specification, the term "refractive index" means the value at a wavelength of 445 nm, and the refractive index usually refers to the value measured with an ellipsometer.

The second embedded layer can be formed, for example, by a method that is known in this field. For example, this can be vapor deposition, sputtering, reactive sputtering, ECR (electron cyclotron resonance) plasma sputtering, magnetron sputtering, ion beam assist deposition, ion plating, laser ablation, CVD (Chemical Vapor Deposition), spraying, spin coating, dipping, a combination of these two or more methods, a combination of these methods and oxidation treatment (thermal treatment), or any of various other methods.

Examples of conditions for forming the second embedded layer include sputtering by using silicon or silicon oxide as the target, when forming a film of the second embedded layer (such as $SiO_2$). Here, argon gas, a mixture of argon gas and oxygen gas, or the like can be used. Other examples of film forming methods include a method in which the sputtering gas is changed from one whose oxygen partial pressure is low or zero to one whose oxygen partial pressure is high, a method in which the film formation rate is lowered, a method in which the RF power is increased, a method in which the distance between the target and the substrate is varied, and a method in which the pressure is lowered. When a protective film is to be formed by sputtering, a method in which the temperature of the substrate is raised or lowered may also be used. After this, a heat treatment may be performed as needed.

Also, as shown in the embodiment shown in FIGS. 1*a* and 1*c*, a conductive layer 11 includes a first portion 11*a* and a second portion 11*b*. The first portion 11*a* overlays a main surface of the second embedded layer 9 and the second portion 11*b* is embedded within at least a section of the groove 15 of the second embedded layer 9. As shown in FIG. 1*c*, the groove 15 has an overall length $L_1$ measured in a lengthwise direction of the groove 15. The second portion 11*b* of the conductive layer 11 has an overall length $L_2$, also measured in a lengthwise direction of the groove 15. The groove 15 has at least two sections, a first section 15*a* and a second section 15*b*. The first embedded layer 10 is embedded within the first section 15*a*, located at an end of the groove 15. The second portion 11*b* of the conductive layer 11 is embedded within the second section 15*b* of the groove 15. The overall length $L_1$ of the groove 15 is greater than the overall length $L_2$ of the second portion 11*b* of the conductive layer 11. The first embedded layer 10 has an end surface 10*a* (See FIG. 1*c*) that contacts an end face 11*c* of the second portion 11*b* of the conductive layer 11. The conductive layer 11, may be formed all the way over the main surface of the second embedded layer 9 as shown in FIGS. 1*a* to 1*d*, or may be embedded in just the groove as shown in FIGS. 5*c* and 5*c*'. This conductive layer 11 is such that the end face 11*c* of the conductive layer 11 in the cavity direction is disposed more to the inside than the cavity end face in the active layer (see 11 in FIGS. 5*b*' to 5*d*'). That is, the end face 11*c* in the cavity direction is apart from the cavity end face of the active layer. Consequently, the conductive layer does not affect cleavage of the laminate of the semiconductor layer, so cleavage can be performed reliably in the intended direction, and a good cavity end face can be obtained. To obtain a good cavity end face, the conductive layer may be formed apart from the cavity end face at least one of the pair of opposing end faces, but preferably both end faces are apart. There are no particular restrictions on such distance, if the cavity length is about 400 to 1500 μm, a distance may be about 0.001 to 10% thereof, and more specifically, it is suitably disposed to the inside with a length of about 0.1 to 10 μm. The end face 11c of the conductive layer other than that in the cavity direction may coincide with the end face of the laminate, but preferably is disposed to the inside of the laminate end face. Further, an electrode 12 (a p-pad electrode) overlays the conductive layer 11 and is spaced apart from the first embedded layer 10.

The conductive layer is formed in contact with the second conductivity type semiconductor layer in the grove, and functions as an ohmic electrode. The conductive layer embedded in the groove of the second embedded layer functions as a clad layer which confines light within the waveguide of the preferable laser by a refractive index differences between the second embedded layer and the conductive layer.

The conductive layer preferably has, for example, a refractive index b that is either greater than the refractive index a of the second embedded layer or is less than the refractive index d of the active layer, or satisfies both of these.

The conductive layer can be formed from a conductive oxide layer, for example. It can also be formed from a layer containing at least one element selected from the group comprising zinc (Zn), indium (In), tin (Sn), and magnesium (Mg). In particular, examples include ZnO (about 1.95 of refractive index), $In_2O_3$, $SnO_2$, ATO, ITO (complex oxide of In and Sn), MgO, and the like, among these, ITO (about 2.0 of refractive index) is preferable.

When the conductive layer is formed from a transmissive material, the absorption of light by the conductive layer must be taken into account more than when a metal material with high reflectivity is used. To suppress absorption, the layer with good film quality must be formed, and a material with high transmissivity is considered to have good film quality. This conductive layer is preferably one that will not absorb not only visible light, but also light with a wavelength of 360 to 650 nm, and one that can transmit light efficiently, such as one having a transmissivity of at least 90%, or at least 85%, or at least 80%. This allows a semiconductor laser element with the intended wavelength to be utilized as an electrode. The conductive layer also may have a resistivity of $1.0 \times 10^{-2}$ $\Omega cm^2$ or less, preferably about $1 \times 10^{-3}$ to $1 \times 10^{-5}$ $\Omega cm^2$. This allows it to be utilized efficiently as an electrode.

There are no particular restrictions on the thickness, it can be suitably adjusted according to the material used, thickness of the second embedded layer and the like. For instance, it may be about 0.1 to 4.0 μm.

Figure 5A:
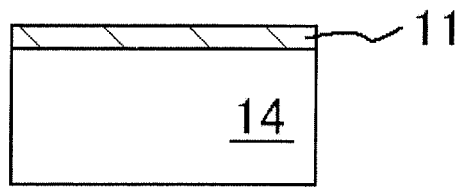
FIGS. 5a-5c include schematic cross-sectional views, and FIGS. 5b'-5d' include plan views showing a manufacturing another semiconductor laser element according to the present invention.
Figure 5B:
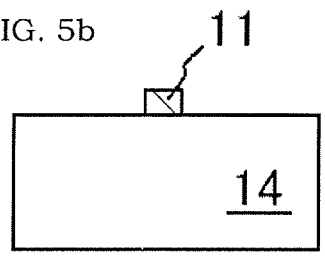
Figure 5B:
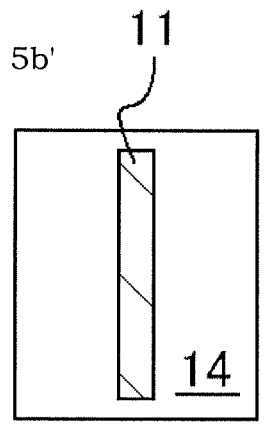
Figure 5C:
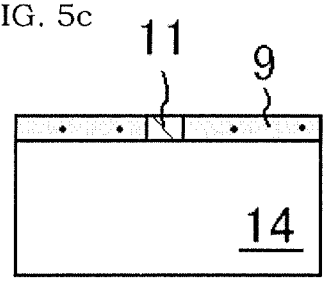
Figure 5C:
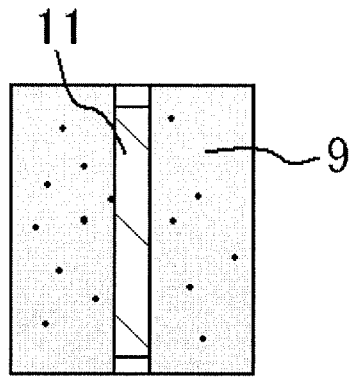

As shown in FIG. 5a, for example, the conductive layer is formed on the entire surface of the semiconductor laminate 14 (11 in FIG. 5a), and can be patterned in the desired shape by a standard method such as photolithography and etching (see FIGS. 5b, 5b', 4c, 4c', and 6b). Also, a masking layer may be formed ahead of time on the semiconductor layer, the conductive layer fanned on this, and then the desired product formed by lift-off method.

The conductive layer can be formed by any method known in this field. For instance, sputtering, ion beam assisted vapor deposition, ion implantation, ion plating, laser ablation, a combination of one of these methods with a heat treatment, and various other such methods can be employed.

More specifically, in forming the conductive layer, such as an ITO film by sputtering, examples include a method in which the sputtering gas is changed from one whose oxygen partial pressure is low or zero to one whose oxygen partial pressure is high, or the oxygen partial pressure is gradually raised; a method in which a target with a high indium content or a target with a low oxygen content is used in addition to a target for forming an ITO film, and midway this is changed to a target with a high indium content or a target with a low oxygen content; and a method in which a film is fowled by gradually or suddenly raising the power supplied to the sputtering apparatus.

Other examples include a method in which, in the formation of the conductive layer, such as an ITO film by vacuum vapor deposition, for example, a method in which the temperature of the semiconductor layer is gradually or suddenly raised or lowered, a method in which the film formation rate is suddenly decreased, and a method in which an ion gun is used to bombard with oxygen ions during film formation.

Further, a first embedded layer is embedded inside the groove of the second embedded layer and on the cavity end face side from the end face of the conductive layer. That is, the first embedded layer is embedded inside the groove provided to the second embedded layer and on the cavity end face side of the groove, and the conductive layer is embedded on the inside. The first embedded layer may be formed at least one end of the groove. In this case, the first embedded layer and the conductive layer are embedded in that order, starting from the cavity end face side. Preferably, the layer is provided at both ends. In this case, the first embedded layer, the conductive layer, and another first embedded layer are formed in that order, starting from the cavity end face side inside the groove.

By thus disposing the first embedded layer on the cavity end face side separately from the conductive layer, there will be no problems such as cleavage, peeling, etc. of the conductive layer near the cavity end face, and adhesion with the conductive layer by the end face can be improved, so light can be confined more reliably. As a result, distortion of the laser beam emitted from the cavity end face is prevented, and a better FFP pattern can be obtained. Also, the flow of current to the cavity end face can be kept to a minimum, the generation of heat at the cavity end face is suppressed, and the COD level can be improved. Particularly when the output of the laser element is raised, more heat is generated, but heat generation can be reduced at the cavity end face where such heat generation is particularly pronounced.

That is, when the conductive layer is formed up to the vicinity of the cavity end face, micro-leak develops near the cavity end face, power consumption goes up, most heat is generated by the laser element, deterioration is accelerated, and the life-lasting of the element is cut short. Also, if the area near the cavity end face is opened and the semiconductor layer exposed, with a nitride semiconductor laser, the refractive index differential with the semiconductor layer near the cavity end face causes the beam emitted from the laser to head downward, and disturbance in the FFP shape is seen. In contrast, when the first embedded layer is embedded near the cavity end face as with the present invention, a semiconductor laser with a good FFP shape and good element reliability can be obtained.

The first embedded layer preferably has a refractive index c that is equal to or greater than the refractive index a of the second embedded layer (and particularly greater than the refractive index a), or a refractive index c that is less than the refractive index d of the active layer, or has a refractive index that satisfies both of these. It is particularly preferable if the first embedded layer has a refractive index close to the refractive index of the conductive layer, such as a refractive index that is within the range of [refractive index of the conductive layer]±1, and preferably ±0.5. Also, if the first embedded layer is formed from a different material from that of the second embedded layer, and is formed from a material having a higher refractive index than the second embedded layer, this is preferable because there will be less scattering of light, and the threshold value can be lowered. From another standpoint, it is preferable for the layer to be composed of a material having a barrier of at least the drive voltage of the semiconductor laser element.

The first embedded layer is preferably formed from a dielectric (hereinafter the first embedded layer will sometimes be referred to as a dielectric layer). For example, an oxide or a nitride, particularly a material selected from the group comprising of $ZrO_2$, $SiO_2$ (about 1.45 of refractive index), $Al_2O_3$, $Nb_2O_3$, $TiO_2$, $Ta_2O_5$, AlN and SiN, among these, $ZrO_2$ and $SiO_2$ are preferable. In particular, if the first embedded layer is formed from an oxide, it will have good adhesion with the conductive layer. Also, it is preferable if the first embedded layer is insulating and has a refractive index that is close to the refractive index of the conductive layer (such as ITO) because light confinement can be improved and a laser beam with the desired shape can be obtained. The first embedded layer may be a single layer, or a plurality of materials of different compositions may be laminated in order to obtain the proper refractive index.

There are no particular restrictions on the thickness of the first embedded layer, it can be suitably adjusted according to the material composition, refractive index and the like, but it is preferable the thickness similar to that of the conductive layer. For instance, the thickness may be about 0.1 to 2.0 μm.

The first embedded layer may be embedded at least inside the groove of the second embedded layer, and may be disposed on the second embedded layer. The end face other than that in the cavity direction may coincide with the end face of the laminate and/or the second embedded layer, or may be disposed on the inside.

The first embedded layer is preferably provided from the cavity end face to the end face of the conductive layer in the cavity direction.

If the first embedded layer is provided after the conductive layer has been provided, it may cover the conductive layer. If the cavity length is about 200 to 1500 μm, then a suitable length is about 0.006 to 5% thereof, and it is suitably about 0.1 to 10 μm.

It is preferable if the first embedded layer is formed from an oxide and if a region is provided in which the first embedded layer touches a conductive oxide film. This improves the adhesion between the conductive layer and the dielectric member, and affords reliable light confinement near the cavity end face. This is effective when the second embedded layer is formed from an oxide.

The first embedded layer such as this, as shown in FIGS. 4c', 4d', 5c', and 5d', can be formed by forming a mask (not shown) that is open in the region where a first embedded layer 10 is to be fog used, either before or after for a conductive layer 11, forming on this the first embedded layer 10, and removing the mask, leaving behind the first embedded layer 10 in the groove. When the conductive layer 11 is formed over everything in the cavity direction, the conductive layer 11 near the cavity end face is removed by etching or the like, after which the first embedded layer 10 may be formed by the same method as above.

As shown in FIGS. 4e' and 4e", the first embedded layer 10 can be formed by being disposed in the groove by working the material of an end face protective film (discussed below) around the cavity end face at the same time that the end face protective film is formed.

FIGS. 4d' and 4e' are cross sections of the groove in the cavity direction.

As shown in FIG. 6a, if the first embedded layer is formed from the same material as a second embedded layer 9, then in the formation of the second embedded layer 9, part of the second embedded layer 9 can be disposed as the first embedded layer by forming the second embedded layer 9 so that it covers the groove near the cavity end face (see A in FIG. 6a).

The first embedded layer can be formed by any method known in this field, as with the second embedded layer. As for the film formation conditions, they can be the same as those used for the second embedded layer as discussed above.

In another embodiment of the semiconductor laser element of the present invention, as shown in FIGS. 10a to 10d, a stripe-like conductive layer 11 is formed sued, parallel to the cavity direction, on a p-side semiconductor layer (such as a third p-side semiconductor layer, a p-side contact layer 8). As long as it has a stripe shape and is in contact with the p-side semiconductor layer, this conductive layer 11 may be formed so as to be embedded in the opening of the second embedded layer (see FIG. 11c', or may be formed over the second embedded layer (see FIG. 13e').

There are no particular restrictions on the stripe width, but as long as enough current can be supplied by contact with the second conductivity type semiconductor layer, the width can be suitably adjusted according to the size of the intended semiconductor laser element and so forth. For example, the width may be about 0.3 to 50 μm, and preferably 3 to 15 μm. When a single mode laser is produced, about 1 to 5 μm is preferable.

Figure 10A:
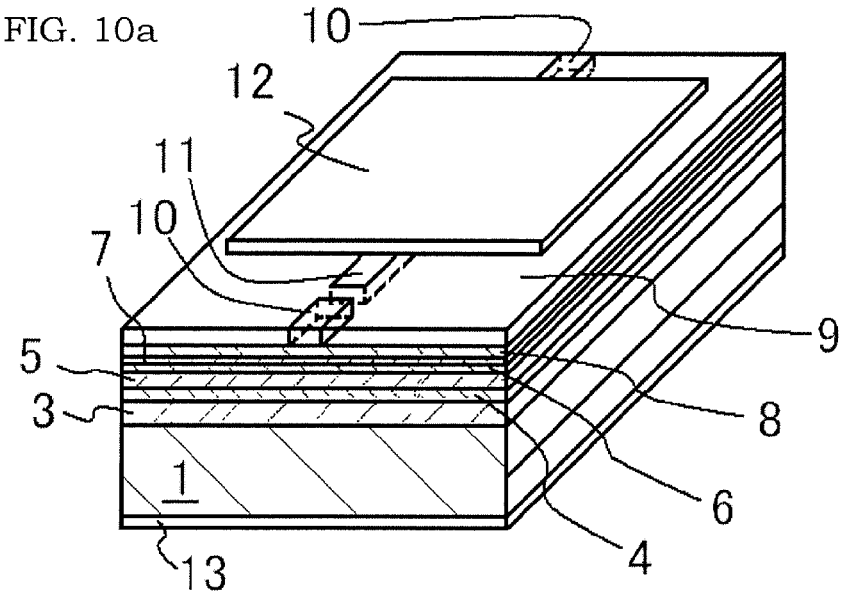
FIG. 10a is a perspective view.
Figure 10B:
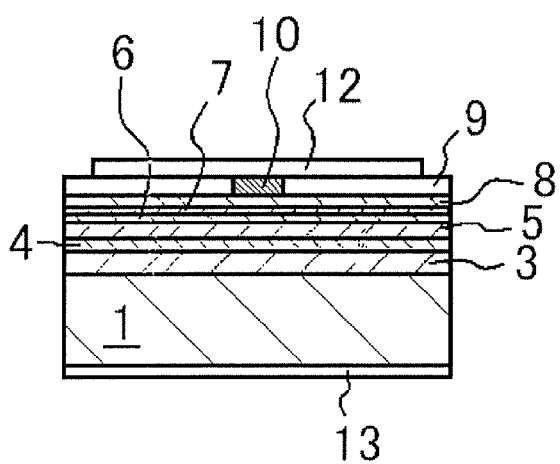
FIG. 10b is a front view.
Figure 10C:
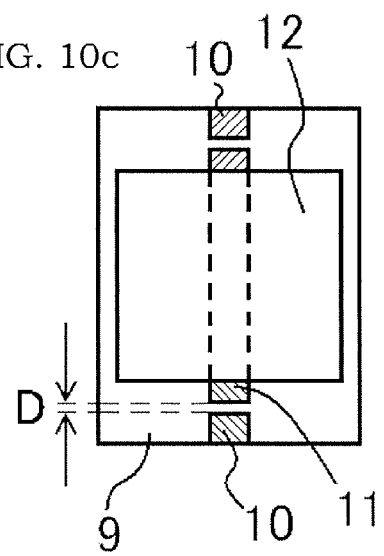
FIG. 10c is a plan view and FIG. 10d is a side view showing the construction of still another semiconductor laser element according to the present invention.
Figure 10D:
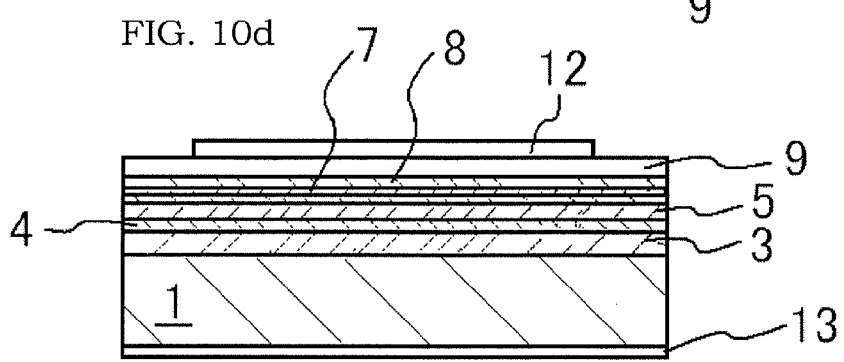

The end face of this conductive layer 11 may be disposed more to the inside than the cavity end face on either the light emission side or the light reflection side (see FIGS. 12 and 13), but is preferably disposed to the inside on both sides (see FIG. 10c). That is, the end face of the conductive layer 11 is apart from the cavity end face. It is particularly preferable if the end face of the conductive layer 11 is apart from the cavity end face at the end face on the light emission side.

At the end face on the light emission side, there are no particular restrictions on such distance, if the cavity length is about 400 to 1500 μm, then a distance may be about 0.001 to 10% thereof, and more specifically, it is suitably disposed to the inside with a length of about 0.1 to 15 μm.

Figure 13A:
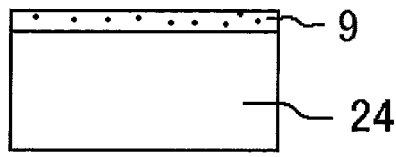
FIGS. 13a-13d include schematic cross-sectional views and FIGS. 13b'-13e' include plan views showing a manufacturing still another semiconductor laser element according to the present invention.
Figure 13B:
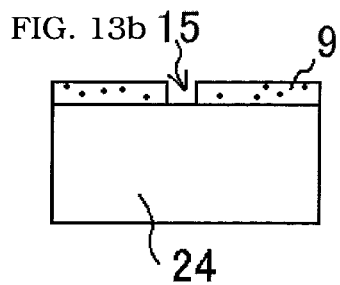
Figure 13B:
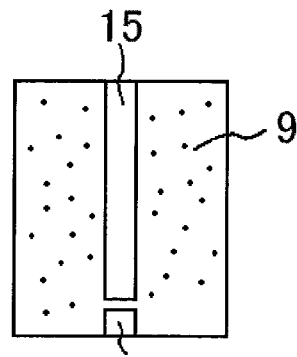
Figure 13C:
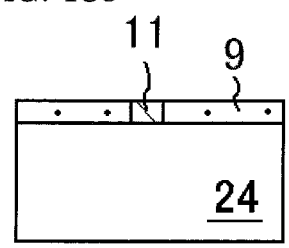
Figure 13C:
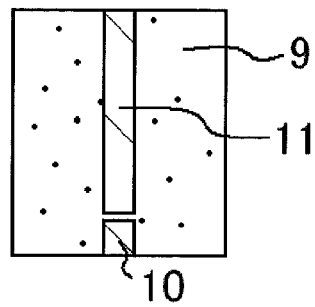
Figure 13D:
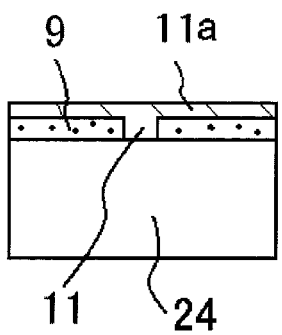
Figure 13D:
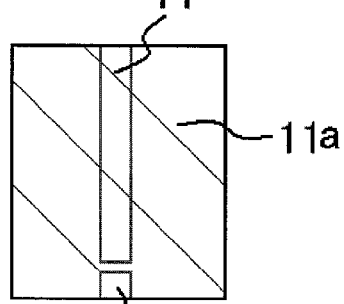
Figure 13E:
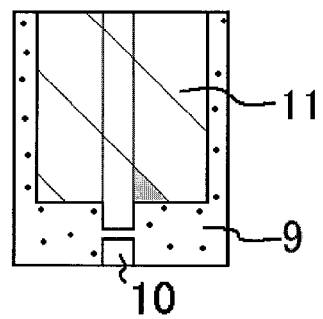
Figure 14A:
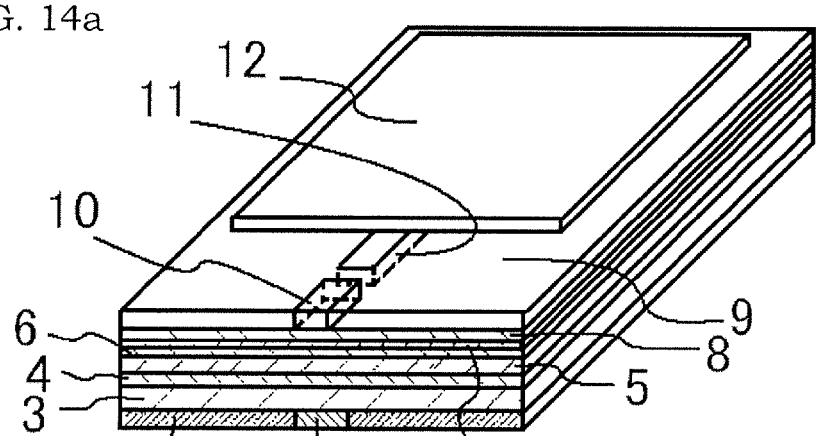
FIG. 14a is a perspective view.
Figure 14B:
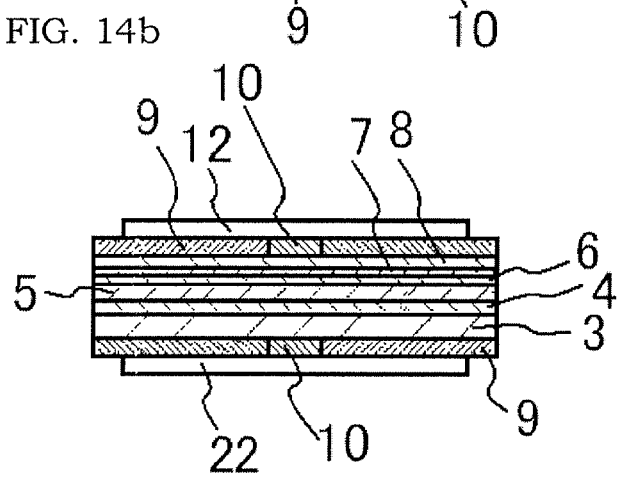
FIG. 14b is a front view.
Figure 14C:
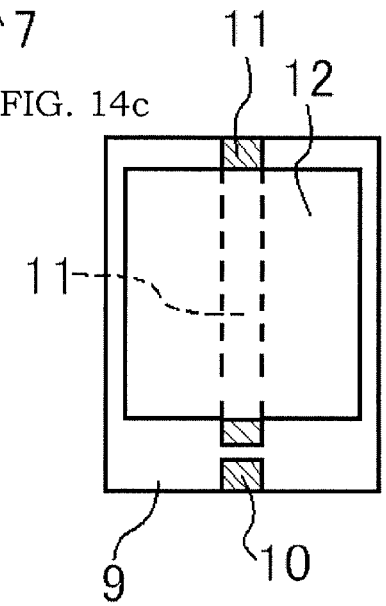
FIG. 14c is a plan view and FIG. 14d is a side view showing the construction of still another semiconductor laser element according to the present invention.
Figure 14D:
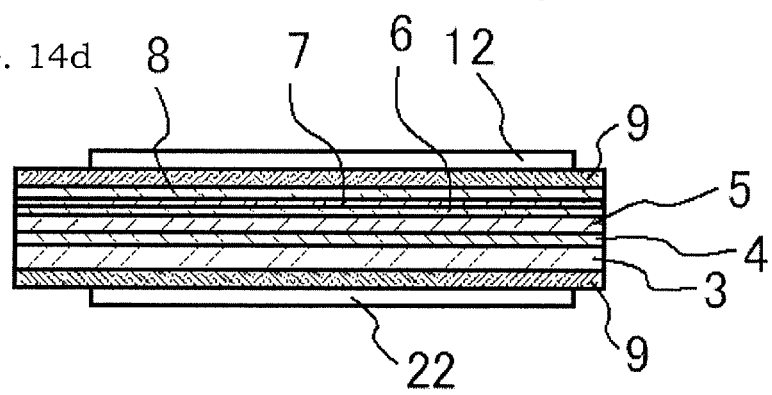

The side face of the conductive layer 11 in the cavity direction may coincide with the side face of the laminate, but is preferably disposed on the inside of the laminate side face, as shown in FIG. 13e'.

As discussed above, the conductive layer functions as an ohmic electrode and/or a clad layer.

As shown in FIGS. 10a and 10c, a first embedded layer 10 having a refractive index that is less than or equal to the refractive index of the conductive layer and that is disposed at substantially the same stripe width as the conductive layer is preferably formed on an extension of the conductive layer at least one of the end faces of the conductive layer on the cavity end face side. This will prevent fluctuation in the light confinement coefficient in the vertical direction near the cavity end face, and this in turn prevents disturbance of the FFP in the vertical direction and changes in the refractive index distribution in the cavity direction. For the reasons given above, it is particularly preferable for the end formed by the first embedded layer to be on the light emission side. Also, to prevent the refractive index distribution from fluctuating in the cavity direction, the refractive index is preferably as given above. Furthermore, if the conductive layer and the first embedded layer are formed from the same material, a substantially constant refractive index distribution can be achieved in the cavity direction, and the confinement of light along the waveguide can be carried out more reliably.

The first embedded layer may be disposed in contact with the conductive layer on the cavity end face side. In this case, the first embedded layer and the conductive layer are preferably made of different materials, that is, materials with different refractive indexes.

Also, the first embedded layer may be disposed away from the conductive layer. For example, the second embedded layer is preferably disposed so as to be sandwiched between the conductive layer and the first embedded layer. The distance separating the conductive layer and the first embedded layer (D in FIG. 10c) may be enough to ensure electrical insulation. It may be about 0.1 μm or more, for example, about 0.5 μm or more, and preferably about 1.0 μm ore more. There are no particular restrictions on the length of the first embedded layer, but an example is a length of no more than 1/50 the cavity length, and preferably a length of no more than about the stripe width, and even more preferably a length of at lest about the thickness of the conductive layer. In particular, it may be about 1 to 5 μm, and about 2.5 to 4.5 μm.

One end face of the first embedded layer is preferably formed up to one end face of the cavity, and more particularly the end face on the light emission side. This allows light to be reliably confined near the cavity end face. The phrase "up to the end face" as used in this Specification means that mismatching, bumpiness, and so forth caused by variance in the etching, mask alignment, and the like is permitted.

The first embedded layer can be formed from the same material as the materials given as examples for the conductive layer. If the two are formed from the same material, they can both be formed in the same step as discussed below, which streamlines the manufacturing process. The conductive layer and the first embedded layer do not, however, necessarily have to be the same.

If the first embedded layer is disposed away from the conductive layer, that is, if the first embedded layer is formed in a floating state near the cavity end face, this will keep the flow of current to the cavity end face to a minimum, suppress the generation of heat at the cavity end face, and raise the COD level. More heat is generated particularly when the output of the laser element is to be made higher, but heat generation can be reduced at the cavity end face where this heat generation is particularly pronounced. If the first embedded layer is disposed near the cavity end face, this particularly allows light to be reliably confined near the cavity end face. As a result, distortion of the laser beam emitted from the cavity end face is prevented, and a good FFP can be obtained.

As shown in FIG. 11, for example, the conductive layer and the first embedded layer can be formed on the entire surface of the semiconductor laminate 24 (11a in FIG. 11a), and can be patterned in the desired shape by a conventional method such as photolithography and etching.

Also, a masking layer having a stripe-like first opening and a second opening that is adjacent to this first opening on one cavity end face side thereof may be formed on the semiconductor laminate, the conductive layer formed on this, and then the conductive layer and the first embedded layer formed by lift-off method.

Furthermore, as shown in FIG. 13a, the conductive layer 11 and the first embedded layer 10 may be formed by forming a second embedded layer 9 (discussed below) on the entire surface of the semiconductor laminate 24, forming a stripe-like groove 15 and a groove 16 that is adjacent to but apart from this groove 15 (see FIGS. 13b and 13b'), and embedding the conductive oxide layer 11 in these grooves 15 and 16 (see FIGS. 13c to 13e').

As discussed above, the conductive layer and the first embedded layer can be formed by any method known in this field.

Also, as discussed above, the second embedded layer 9 is fog ivied in contact with a second conductivity type (p-type) semiconductor layer (such as a third p-side semiconductor layer, the p-side contact layer 8). The second embedded layer 9 is formed on both sides of the conductive layer or so as to surround all or part of the conductive layer, along the above-mentioned stripe-like conductive layer 11.

One end face on the cavity end face side of the second embedded layer 9 (that is, the end face on the light emission side) is preferably in the same plane as the cavity end face because this will prevent micro-leakage near the cavity end face, but part of the region (that is, the region corresponding to the portion where the conductive layer and first embedded layer are disposed as discussed above) is not formed all the way to the cavity end face, and is located to the inside thereof (see FIGS. 10a and 10c). That is, the second embedded layer is formed so as to straddle the region where the conductive layer is formed. In other words, the stripe-like groove (opening) provided to the second embedded layer is not completely open all the way in the cavity direction, and the second embedded layer is formed in part of it.

The end face of the second embedded layer other than the one in the cavity direction may coincide with the end face of the laminate, but is preferably disposed to the inside of the laminate end face.

With the semiconductor laser element of the present invention, the various constituents can be applied mutually in the various embodiments discussed above unless otherwise specified.

With the semiconductor laser element of the present invention, the laminate of the semiconductor layers discussed above is usually formed on a substrate. Examples of the substrate may include insulating substrates, such as sapphire, spinel ($MgAl_2O_4$), and may include SiC, Si, ZnO, GaAs, diamond as well as an oxide substrate such as lithium niobate, neodymium gallate that are lattice matched to a nitride semiconductor, the nitride semiconductor substrate (GaN, AlN and the like) is preferred.

The nitride semiconductor substrate preferably has an off angle of 0.03 to 10° to the first main face and/or the second main face. The thickness of the substrate is from about 50 μm to 10 mm. The nitride semiconductor substrate can be formed by a vapor phase growth method such as MOCVD, HVPE, MBE, or the like, a hydrothermal synthesis method in which crystals are grown in a supercritical fluid, a high pressure method, a flux method, a melt method, or the like. A commercially available substrate may be also used.

A dislocation density may be distributed in-plane over the surface of a nitride semiconductor substrate, either periodically, such as in the foam of stripes, dots, etc. or irregularly. For example, ELO may be used to form alternating stripes of a region with a low dislocation density (such as a first region) and a region with a high dislocation density (such as a second region), or a semiconductor layer may be formed by lateral growth on a substrate, and this semiconductor layer used as a substrate to dispose regions of different crystal defect density, crystal direction, etc., in the form of stripes. Regions with different polarity may be distributed over a substrate. For example, the first and second regions may be broken up by stripes of polarity.

Herein, the expression "low dislocation density region" refers to a region where the number of dislocations per unit of surface area is no greater than $1 \times 10^7/cm^2$, preferably no greater than $1\times10^6/cm^2$, the expression "high dislocation density region" refers to a region having a higher dislocation density than that of this.

When alternating stripes of first and second regions are formed, the width of the first region may by 10 µm to 500 µm, and 100 µm to 500 µm, the width of the second region may by 2 µm to 100 µm, and 10 µm to 50 µm, for example. The stripe shape encompasses those formed as broken lines. The dislocations here can be measured by CL observation, TEM observation, or the like.

Difference crystal growth planes may also be distributed over the surface of a nitride semiconductor substrate. For example, if the (0001) plane is used for the first region, the crystal growth face for the second region is a plane other than the (0001) plane, such as the (000-1) plane, the (10-10) plane, the (11-20) plane, the (10-14) plane, the (10-15) plane, the (11-24) plane or the like. Particularly, the (000-1) plane is preferable. Using a substrate thus locally having different crystal growth planes allows the stress or strain generated within the substrate to be relieved, and makes it possible for a semiconductor layer to be laminated in a film thickness of 5 µm or more without having to form a stress relieving layer on the substrate.

As the nitride semiconductor substrate, a substrate which is described in JP2005-175056-A, JP2004-158500-A, JP2003-332244-A, and the like may be utilized.

A buffer layer, intermediate layer (for example, $Al_xGa_{1-x}N$ ($0\leq x\leq 1$), or the like is preferably formed on the substrate before forming the laminate saving as the laser element.

Also, with the semiconductor laser element of the present invention, it is preferable to form a side face protective film that covers both sides of at least the laminate of semiconductor layers. The side face protective film is preferably formed all the way to the conductive layer by opening up a region that connects to the outside. This side face protective film may also serve as the second embedded layer, that is, it may be formed at the same time and from the same material as the second embedded layer. It may also serve as the first embedded layer. This side face protective film is preferably formed after the conductive layer has been formed, or after the conductive layer and the first embedded layer have been formed, and before the pad electrode (discussed below) has been formed.

Examples of the side face protective film include oxides or nitrides of Ti, Al, Zr, V, Nb, Hf, Ta, Ca, Si and the like. The side face protective film may be formed with a single layer or laminated layer by any method that is known in this field, for example, a variety of methods can be used, such as CVD method, vapor deposition, ECR (electron cyclotron resonance) plasma sputtering, magnetron sputtering. The side face protective film may comprise a single-layer film formed one or more times, with the composition the same but with the different film quality, by varying the manufacturing method or conditions, or may be a laminate of these materials.

A pad electrode is usually formed on the surface of the conductive layer. The pad electrode may have preferably a laminated structure which is composed of a metal including Ni, Ti, Au, Pt, Pd, W, or the like. For instance, examples include a laminating film such as W—Pd—Au or Ni—Ti—Au, Ni—Pd—Au in this order, starting from the conductive layer side. There are no particular restrictions on the thickness of the pad electrode, but the thickness of the final layer of gold is preferably about 100 nm or more.

There are no particular restrictions on the width or length of the pad electrode, but it may be formed such that connection with the outside is possible (such as by wire bonding or the like). For example, it is preferably formed on the conductive layer and the second embedded layer, and formed in a region that is not electrically connected with the first embedded layer.

If the substrate is a conductive substrate, a rear face of the substrate is preferably formed an n-electrode, for example. The n-electrode can be formed by sputtering, CVD method, vapor deposition and the like. The n-electrode may have total thickness of about 1 µm or less and may be a film composed of V (100 Å-thick)-Pt (2000 Å-thick)-Au (3000 Å-thick), Ti (100 Å)-Al (5000 Å), Ti(60 Å)-Pt(1000 Å)-Au(3000 Å), Ti(60 Å)-Mo(500 Å)-Pt(1000 Å)-Au(2100 Å), Ti(60 Å)-Hf (60 Å)-Pt(1000 Å)-Au(3000 Å), Ti(60 Å)-Mo(500 Å)-Ti(500 Å) -Pt(1000 Å)-Au(2100 Å), W—Pt—Au, W—Al—W—Au, or Hf—Al, Ti—W—Pt—Au, Ti—Pd—Pt—Au, Pd—Pt—Au, Ti—W—Ti—Pt—Au, Mo—Pt—Au, Mo—Ti—Pt—Au, W—Pt—Au, V—Pt—Au, V—Mo—Pt—Au, V—W—Pt—Au, Cr—Pt—Au, Cr—Mo—Pt—Au, Cr—W—Pt—Au and the like, starting from the substrate side.

Further, a metalized electrode may optionally be formed on the n-electrode. The metalized electrode may be formed from Ti—Pt—Au—(Au/Sn), Ti—Pt—Au—(Au/Si), Ti—Pt—Au—(Au/Ge), Ti—Pt—Au—In, Au—Sn, In, Au—Si, Au—Ge and the like. There are no particular restrictions on the thickness of the metalized electrode.

With semiconductor laser element of the present invention, the cavity end face is usually formed by cleavage of the substrate and the laminate.

If desired, it is preferable to form an end face protective film composed of a dielectric film on the cavity end face, that is, the light emission side and/or the light reflection side of the cavity plane. The dielectric film is a single layer or multilayer film composed of oxides or nitrides such as $SiO_2$, $ZrO_2$, $TiO_2$, $Al_2O_3$, $Nb_2O_5$, AlN, AlGaN and the like. The dielectric film can be formed with good reproducibility if the cavity plane is formed by cleavage.

This end face protective film can be formed as a dielectric by working it from the cavity end face around and into the groove on the cavity end face side.

Furthermore, the semiconductor laser element of the present invention may have a structure in which the above-mentioned second embedded layer and conductive layer, or as shown in FIGS. 14a to 14d, the above-mentioned first and second embedded layers and the conductive layer, are disposed as a pair on either side of the active layer.

A laser element with this configuration can be formed, for example, by using a laminate of semiconductor layers in which the second embedded layer, the conductive layer, and the first embedded layer are formed on the above-mentioned substrate, the substrate is removed, or part of the n-type semiconductor layer (such as the part up to the clad layer or the light guide layer) is removed, and the second embedded layer, the conductive layer, and the first embedded layer are formed just as above on the removed side. In the first conductivity type semiconductor layer, an n-side pad electrode 22 is formed in place of the p-side pad electrode 12, for example.

Examples of the semiconductor laser element of the present invention will now be described through reference to the drawings.

Example 1

With the semiconductor laser element in this example, as shown in FIGS. 1a to 1d, an n-type semiconductor layer, an active layer 5, and a p-type semiconductor layer are laminated on a substrate 1, and a second embedded layer 9 having a stripe-like groove is formed on the p-type semiconductor layer near the center thereof. A conductive layer 11 is formed that reaches over the second embedded layer 9, is inside the groove of the second embedded layer 9, and is in contact with the p-type semiconductor layer. Both of the end faces of this conductive layer 11 in the cavity direction are apart from and to the inside of the cavity end face. The first embedded layer 10 is disposed within the groove of the second embedded layer 9, from the cavity end face all the way to the end faces of the conductive layer 11 at both ends of the groove. Also, a p pad electrode 12 is formed on the conductive layer 11, and an n electrode 13 is formed on the rear face of the substrate 1.

The method for manufacturing this semiconductor laser element will now be discussed.

First, a substrate 1 composed of n-type GaN is set in a reaction vessel, an n-type clad layer 3 composed of $Al_{0.33}Ga_{0.67}N$ doped with Si was grown using trimethylaluminum (TMA), trimethylgallium (TMG) and ammonia ($NH_3$) with a silane gas for an impurity gas.

Next, n-side light guide layer 4 composed of undoped GaN was grown at a growth the same temperature using TMG and ammonia.

The temperature was set to 950° C., trimethylindium (TMI), TMG and ammonia is used, a barrier layer composed of $In_{0.02}Ga_{0.98}N$ doped with Si was grown. The silane gas was stopped, using TMI, TMG and ammonia, a well layer composed of undoped $In_{0.06}Ga_{0.94}N$ is grown. This process was repeated 2 times, then a barrier layer composed of $In_{0.02}Ga_{0.98}N$ was grown at the same temperature using TMI, TMG and ammonia to grow an active layer 5 (refractive index: about 2.5) composed of a 2 pair multiple quantum well structure (MQW)).

TMI was stopped, a p-type cap layer 6 composed of p-type $Al_{0.30}Ga_{0.70}N$ doped with Mg is grown using TMA, TMG and $NH_3$, and flowing bis-cyclopentadienyl magnesium ($Cp_2Mg$).

Next, $Cp_2Mg$ and TMA were stopped, and p-side light guide layer 7 composed of undoped GaN was grown at a temperature of 1050° C.

Finally, a p-side contact layer 8 composed of p-type GaN doped with Mg is grown on this using TMG and ammonia and flowing $Cp_2Mg$.

Next, a second embedded layer 9 (refractive index: 1.5) composed of $SiO_2$ and having a thickness of about 500 nm was formed by CVD method on a wafer on which a semiconductor laminate 14 had been formed (see FIG. 4a).

Then, a photoresist having a stripe-like opening (with a stripe width of about 5 μm) was formed on the second embedded layer 9, and this photoresist was used as a mask in wet etching with BHF, thereby selectively removing part of the second embedded layer 9, and forming a groove 15 whose bottom reaches the semiconductor layer. This groove 15 was formed so as to be open in the cavity direction (see FIGS. 4b and 4b'). After this, the photoresist was removed.

Then, a conductive layer 11 (refractive index: about 2.0) composed of ITO was formed on the entire surface of the second embedded layer 9 including the groove 15. A photoresist is formed on this so as to expose about 5 μm from the cavity end face. RIE was performed using this photoresist as a mask, and part of the conductive layer was selectively removed so as to expose the semiconductor layer in the groove 15. Consequently, the semiconductor layer was exposed within a range of 5 μm on the cavity end face side of the groove 15 (see FIGS. 4c and 4c').

Next, a first embedded layer (film thickness: about 400 nm) composed of $ZrO_2$ was formed on the exposed semiconductor layer and the photoresist. After this, the photoresist was removed, which embedded the first embedded layer 10 composed of $ZrO_2$ in the groove 15 (see FIGS. 4d' and 4d"). Consequently, inside the groove provided to the second embedded layer, the first embedded layer was embedded on the cavity end face side of the groove and the conductive layer was embedded on the inside.

Here, a side face protective film composed of $ZrO_2$ can be formed at the same time by forming the photoresist that is formed on the conductive layer 11 composed of ITO apart from the side face of the nitride semiconductor laser element.

After this, annealing was performed under an oxygen atmosphere at 600° C., for example, to reduce the contact resistance of the p-type semiconductor layer.

The p pad electrode 12 was formed on the conductive layer 11.

The rear face of the substrate 1 was ground, and an n electrode 13 was formed on the rear face of the ground n-type GaN substrate 1.

After this, the GaN substrate 1 was cleaved perpendicular to the cavity direction, for example, to change the wafer into a bar shape, and a cavity plane was produced at the cleavage plane of this bar.

Then, a dielectric film was formed as an end face protective film at the cavity plane. On the light emission side, $Al_2O_3$ was formed in a film thickness of 70 nm. On the opposite side, a multilayer dielectric film was formed from a laminate of $ZrO_2$ and $SiO_2$ (total film thickness of 700 nm).

Finally, the product was separated parallel to the cavity plane to make the bar-shaped wafer into a chip, and obtain a semiconductor laser element.

Example 2

As in Example 1, a conductive layer 11 composed of ITO was formed in a thickness of 0.4 μm by sputtering over a wafer on which a semiconductor laminate 14 had been formed (see FIG. 5a).

After this, a stripe-like photoresist (the stripe width was about 5 μm, and the length was about 10 μm shorter than the cavity length of the semiconductor laminate 14) is formed on the conductive layer 11. This photoresist was used as a mask in reactive ion etching with HI gas, for example, thereby selectively removing the conductive layer 11 exposed from the photoresist. Consequently, a stripe-like conductive layer 11 was formed (see FIGS. 5b and 5b'). The conductive layer 11 here was formed so that the end face opposite the cavity direction was disposed about 5 μm to the inside of the cavity end face of the semiconductor layer laminate.

Then, a second embedded layer 9 (refractive index: about 1.5) composed of $SiO_2$ and a thickness of about 400 nm was formed by sputtering on the exposed semiconductor layer and the photoresist. A side face protective film can also be formed at the same time. The photoresist and the second embedded layer 9 formed on it were then removed. Consequently, the conductive layer 11 was embedded only in the groove of the second embedded layer 9.

A photoresist was then formed in a shape that exposed the region where the first embedded layer was to be fog med. The second embedded layer in the exposed portion was removed by wet etching, and the semiconductor layer was exposed (see FIGS. 5c and 5c').

Figure 5D:
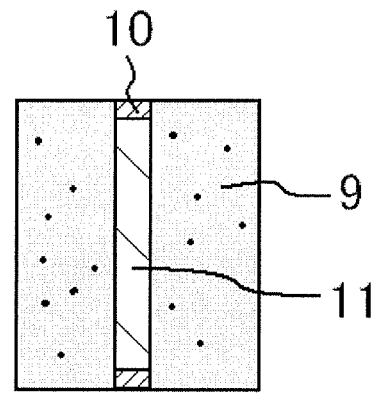

A first embedded layer was formed by sputtering on the exposed semiconductor layer and the photoresist. After this, the photoresist was removed. This resulted in the first embedded layer 10 being embedded in the groove 15 on the opposite cavity plane sides (see FIG. 5d').

Also, in exposing the region where the first embedded layer is to be formed, the photoresist may first be removed, then a photoresist formed apart from the side face of the nitride semiconductor laser element and the region where the first embedded layer is formed. Consequently, a side face protective film composed of $ZrO_2$ can be formed simultaneously with the formation of the first embedded layer, on the previously formed side face protective film composed of $SiO_2$. Here, the first embedded layer is formed on the semiconductor layer, on the photoresist and on the second embedded layer.

From this point on, a semiconductor laser element was formed in the same manner as in Example 1.

Comparative Example 1

Figure 3A:
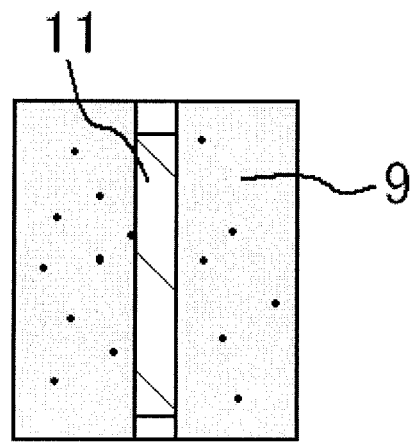
FIG. 3a and FIG. 3b are plan views showing the construction of comparative examples of the semiconductor laser element.

As shown in FIG. 3a, this laser element has substantially the same constitution as the laser element in Example 1 and was formed by the same method as in Example 1, except that no dielectric oxide film layer was fat Hied, and the conductive layer 11 was embedded in the groove provided to the second embedded layer 9.

Comparative Example 2

Figure 3B:
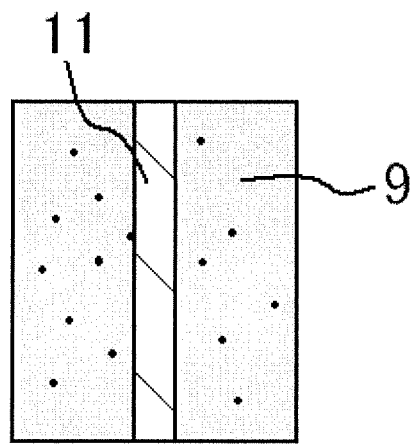

As shown in FIG. 3b, this laser element has substantially the same constitution as the laser element in Example 2 and was formed by the same method as in Example 2, except that no dielectric oxide film layer was formed, and the conductive layer 11 was embedded in the groove provided to the second embedded layer 9 so as to coincide with the cavity end face.

The FFP intensity distribution in the vertical direction, the COD level, and the service life were tested for the laser elements obtained in Examples 1 and 2 and Comparative Examples 1 and 2.

Figure 7A:
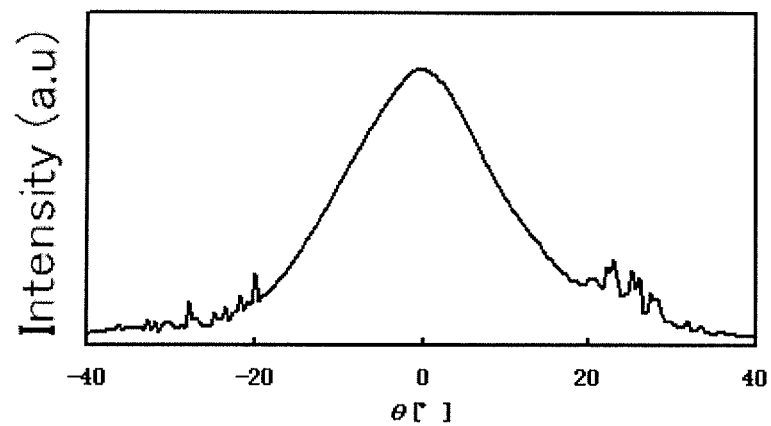
FIGS. 7a to 7c are charts showing FFP of the semiconductor laser element according to the present invention comparing to the laser element.
Figure 7B:
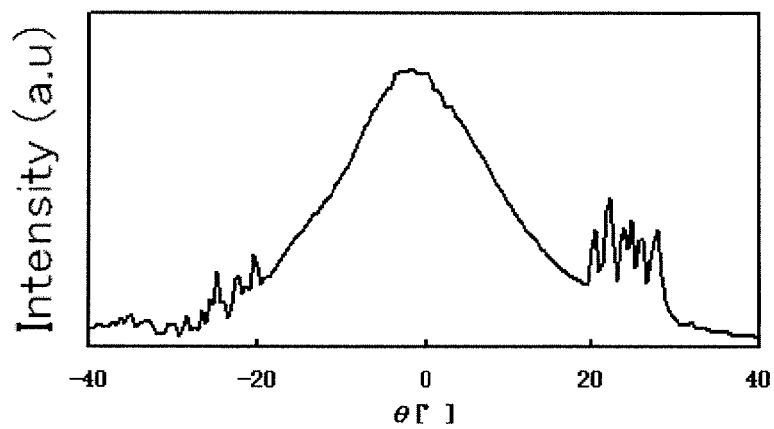
Figure 7C:
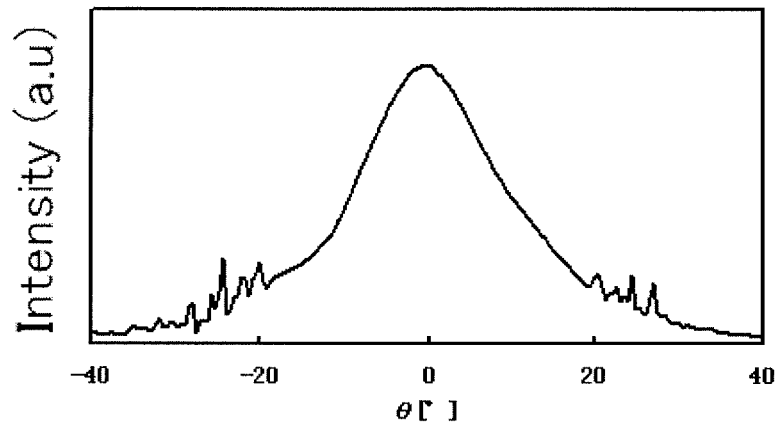

As a result, the FFP intensity distribution in the vertical direction was as shown in FIGS. 7a to 7c, which illustrate Example 1, Comparative Example 1, and Comparative Example 2, respectively, in which roughly similar good results were obtained with the laser elements of Example 1 and Comparative Example 2, but with the laser element of Comparative Example 1, strain was produced because of confinement in the longitudinal direction, and it was confirmed that a stable FFP could not be obtained.

As to the COD level, as shown in Table 1 it was highest with the laser element of Example 2, and was still extremely high and about the same with the laser elements of Example 1 and Comparative Example 1. On the other hand, the result was low with the laser element of Comparative Example 2. The COD level was measured as follows; Measurements were made for 20 laser elements in each of the Examples and Comparative Examples, and the average value is given for 18 samples after excluding the highest and lowest values.

TABLE 1

| | COD Level |
|---|---|
| Example 1 | 1658 mW |
| Example 2 | 1842 mW |
| Comparative Example 1 | 1638 mW |
| Comparative Example 2 | 936 mW |

Figure 8:
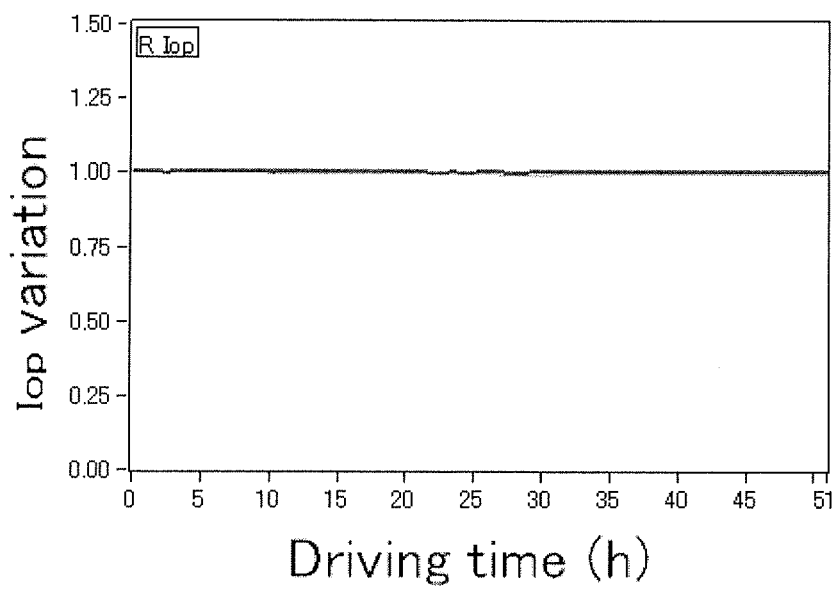
FIG. 8 is a chart showing service life property of the semiconductor laser element according to the present invention.
Figure 9:
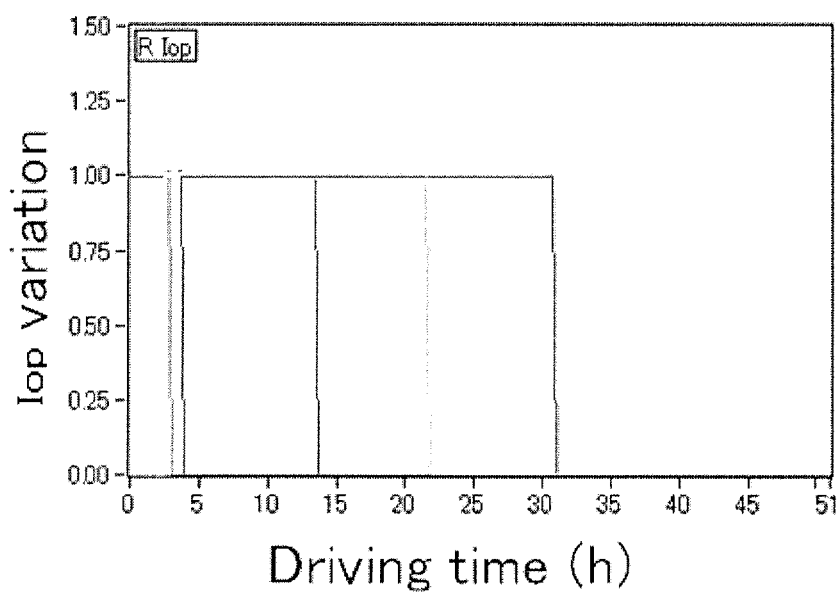
FIG. 9 is a chart showing service life property of the semiconductor laser element according to the comparative laser element.

In the service life test, as shown in FIG. 8 (Example 2) and FIG. 9 (Comparative Example 2), respectively, it was confirmed that the laser element of Example 2 operated stably.

With Comparative Example 2, meanwhile, it was confirmed that oscillation came to a sudden halt.

In the service life test, a semiconductor laser element with an oscillation wavelength of 408 nm was driven at an operating temperature of 25° C. and an output of 500 mW, and by APC drive, and the change over time in the drive current (drive current/initial drive current) was measured.

Thus, with the semiconductor laser elements of Examples 1 and 2, because a dielectric oxide film was reliably disposed near the cavity end face separately from the conductive layer, there were no problems such as cleavage or peeling of the conductive layer near the cavity end face, and adhesion with the conductive layer by the end face can be improved, so light can be confined more reliably. Thus, distortion of the laser beam emitted from the cavity end face is prevented, and a good FFP can be obtained.

Also, the flow of current to the cavity end face can be kept to a minimum, the generation of heat at the cavity end face is suppressed, and the COD level can be improved.

In particular, with the semiconductor laser element of Example 2, as shown in FIG. 5, since the conductive layer is formed by RIE, the shape is easier to control, the conductive layer can be formed with good precision at the desired location, and the COD level can in turn be raised.

Furthermore, the service life can be extended.

On the other hand, with the semiconductor laser element of Comparative Example 1, an abrupt change in the light confinement coefficient near the cavity plane was seen to cause disturbance in the FFP intensity distribution in the vertical direction, and it was confirmed that it was very difficult to drive the laser element for an extended period. Also, with the semiconductor laser element of Comparative Example 2, electrical conduction near the end face led to end face deterioration, the COD level was lower than in other cases, and it was confirmed that it was very difficult to drive the laser element for an extended period.

Example 3

As in Example 1, a conductive layer 11 and a second embedded layer 9 having a groove are formed on a wafer on which a semiconductor laminate had been formed.

After this, as in Example 1, a p pad electrode 12 and an n electrode 13 are formed, and the GaN substrate 1 is cleaved to produce a cavity plane.

Then, a dielectric film is formed at the cavity planes. On the light emission side, $Al_2O_3$ is formed in a film thickness of 70 nm. On the opposite side, a multilayer dielectric film is formed from a laminate of $ZrO_2$ and $SiO_2$ (total film thickness of 700 nm). Here, the dielectric film is formed so as to work the $Al_2O_3$ film around the upper face of the element, which embedded the dielectric layer 10 into the groove 15 near the cavity end face (see FIGS. 4e' and 4e'').

From this point on, a semiconductor laser element was formed in the same manner as in Example 1.

As a result, the same effect is provided as in Example 1.

Example 4

As in Example 1, a second embedded layer 9 was formed over a wafer on which a semiconductor laminate had been formed, and a photoresist having a stripe-like opening (with a stripe width of about 5 μm) was formed. Here, the opening in the photoresist was made from a location about 5 μm away from the two cavity end faces. This photoresist was used as a mask in wet etching with BHF, thereby selectively removing part of the second embedded layer 9, and forming a groove whose bottom reaches the semiconductor layer. Consequently, the second embedded layer was embedded in the groove near the cavity end face (see A in FIG. 6a), and this area can function as the first embedded layer 10.

Figure 6B:
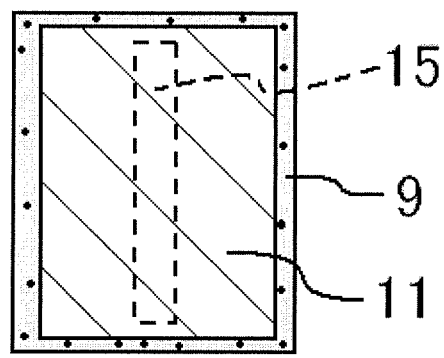

After that, a conductive layer 11 is formed in the same manner as in Example 1 (see FIG. 6b).

As a result, the same effect is provided as in Example 1.

With the semiconductor laser element of this example, as in Example 1, there were no problems such as cleavage or peeling of the conductive layer near the cavity end face, and adhesion with the conductive layer by the end face can be improved, so light can be confined more reliably. Thus, distortion of the laser beam emitted from the cavity end face is prevented, and a good FFP can be obtained as well as the service life can be extended.

Also, the flow of current to the cavity end face can be kept to a minimum, the generation of heat at the cavity end face is suppressed, and the COD level can be improved.

Example 5

With the semiconductor laser element in this example, the conductive layer was formed about 10 μm away from the two cavity end faces, and the first embedded layer was embedded in the semiconductor layer exposed from the end face of the conductive layer up to the cavity end face. In all other respects, a semiconductor laser element was formed in the same manner as in Example 1.

With the semiconductor laser element in this example, the same effect is provided as in Example 1.

Example 6

With the semiconductor laser element in this example, the conductive layer was formed about 15 μm away from the two cavity end faces, and the first embedded layer was embedded in the semiconductor layer exposed from the end face of the conductive layer up to the cavity end face. In all other respects, a semiconductor laser element was formed in the same manner as in Example 1.

With the semiconductor laser element in this example, the same effect is provided as in Example 1.

Example 7

With the semiconductor laser element in this example, the conductive layer was formed about 5 μm away from the cavity end face only on the light emission side, and the first embedded layer was embedded in the semiconductor layer exposed from the end face of the conductive layer up to the cavity end face. In all other respects, a semiconductor laser element was formed in the same manner as in Example 1.

With the semiconductor laser element in this example, the same effect is provided as in Example 1.

Example 8

With the semiconductor laser element in this example, the conductive layer was formed about 5 μm away from the cavity end face on the light emission side, and was formed about 10 μm away from the cavity end face on the reflective side. The first embedded layer was embedded in the semiconductor layer exposed from the end face of the conductive layer to the cavity end face. In all other respects, a semiconductor laser element was formed in the same manner as in Example 1.

With the semiconductor laser element in this example, the same effect is also provided as in Example 1.

Example 9

With the semiconductor laser element in this example, a semiconductor laser element was formed in the same manner as in Example 1, except that the width of the groove was changed to 10 μm.

With the semiconductor laser element of this example, in addition to providing the same effects as in Example 1, the output can be increased by widening the groove.

That is, when the output of a laser element is raised, more heat is generally produced, but thus widening the groove reduces the amount of heat generated at the cavity end face where heat generation is particularly pronounced, and allows a comparable COD level and service life characteristics to be obtained.

Example 10

With the semiconductor laser element in this example, a semiconductor laser element was formed in the same manner as in Example 1, except that the first embedded layer is formed from AlN.

With the semiconductor laser element in this example, the same effect is provided as in Example 1.

Example 11

With the semiconductor laser element of this example, a laminate is formed according to Example 1, and a semiconductor laser element is formed in the same manner as in Example 1, except that the semiconductor layers are to have a constitution as shown in Table 2, and the oscillation wavelength of the laser element is set to about 440 to 450 nm.

TABLE 2

| | |
|---|---|
| P-side contact layer | p-GaN: 15 nm |
| P-side light guide layer | GaN: 150 nm |
| P-side cap layer | p-$Al_{0.25}Ga_{0.75}N$: 10 nm |
| Active layer (MQW) | Uppermost barrier $In_{0.05}Ga_{0.95}N$: 70 nm layer |
| | 2nd well layer $In_{0.12}Ga_{0.88}N$: 3 nm |
| | 2nd barrier layer GaN: 14 nm |
| | 1st well layer $In_{0.12}Ga_{0.88}N$: 3 nm |
| | 1st barrier lyaer n-$In_{0.05}Ga_{0.95}N$: 70 nm |
| N-side light guide layer | GaN: 150 nm |
| N-side clad laayer | n-$Al_{0.10}Ga_{0.90}N$: 1500 nm |
| Second n-type layer | n-$In_{0.04}Ga_{0.96}N$: 150 nm |
| First n-type layer | n-$Al_{0.02}Ga_{0.98}N$: 1000 nm |

In the table, "n-" means to be doped with n-type impurity, and "p-" means to be doped with p-type impurity.

With the semiconductor laser element in this example, the same effect is provided as in Example 1.

Example 12

With the semiconductor laser element of this example, a laminate is formed according to Example 1, and a semiconductor laser element is formed in the same manner as in Example 1, except that the semiconductor layers are to have a constitution as shown in Table 3, and the oscillation wavelength of the laser element is set to about 370 to 380 nm.

TABLE 3

| | |
|---|---|
| P-side contact layer | p-GaN: 15 nm |
| P-side light guide layer | $Al_{0.06}Ga_{0.94}N$: 140 nm |
| P-side cap layer | p-$Al_{0.30}Ga_{0.70}N$: 10 nm |
| Active layer (SQW) | Uppermost barrier $Al_{0.15}Ga_{0.85}N$: 5 nm layer |
| | Wwell layer $In_{0.01}Ga_{0.99}N$: 10 nm |
| | 1st barrier layer n-$Al_{0.15}Ga_{0.85}N$: 7 nm |
| N-side light guide layer | $Al_{0.06}Ga_{0.94}N$: 140 nm |
| N-side clad laayer | n-$Al_{0.11}Ga_{0.89}N$: 700 nm |
| Second n-type layer | n-$In_{0.04}Ga_{0.96}N$: 150 nm |
| First n-type layer | n-$Al_{0.02}Ga_{0.98}N$: 2000 nm |

Example 13

With the semiconductor laser element in this example, as shown in FIGS. 2a to 2d, an n-type semiconductor layer, an active layer 5, and a p-type semiconductor layer are laminated, and a second embedded layer 9 having a stripe-like groove is formed on the p-type semiconductor layer near the center thereof. A conductive layer 11 is formed that reaches on the second embedded layer 9, is inside the groove of the second embedded layer 9, and is in contact with the p-type semiconductor layer. The end faces of this conductive layer 11 in the cavity direction are apart from and to the inside of the cavity end face. The first embedded layer 10 is disposed inside the groove of the second embedded layer 9, from the cavity end face all the way to the end faces of the conductive layer 11. Also, a p pad electrode 12 is formed on the conductive layer 11.

Further, the second embedded layer 9 having a stripe-like groove is also formed on an n-type semiconductor layer near the center thereof, and, as described above, the conductive layer 11 that extends over the second embedded layer 9 is formed inside the groove of the second embedded layer 9 and in contact with the n-type semiconductor layer. This conductive layer 11 is such that its end face in the cavity direction is apart from and to the inside of the cavity end face. The first embedded layer 10 is disposed inside the groove of the second embedded layer 9 and all the way from the cavity end face to the end face of the conductive layer 11. Also, the n pad electrode 13 is formed over the conductive layer 11.

The method for manufacturing this semiconductor laser element will now be discussed.

A laminate of semiconductor layers, a second embedded layer 9, a conductive layer 11, a first embedded layer 10 are formed in the same manner of Example 1, and then up to an n-type clad layer 3 from a substrate are removed by grinding Over the surface of thus obtained n clad layer are fanned a second embedded layer 9, a conductive layer 11 and a first embedded layer 10.

After this, a p pad electrode 12, an n electrode 13 and the like are formed in the same manner as in Example 1.

The semiconductor laser element thus obtained is similar to that in Example 1 in that adhesion with the conductive layer by the end face can be improved, so light can be confined more reliably, and the generation of heat at the cavity end face is suppressed, the COD level can be improved, a good FFP can be obtained, and the service life can be extended.

Example 14

With the semiconductor laser element in this example, as shown in FIGS. 10a to 10d, n-side semiconductor layers (an n-type clad layer 3, an n-side light guide layer 4), an active layer 5, and p-side semiconductor layers (a cap layer 6, p-side light guide layer 7, p-type contact layer 8) are laminated on the substrate 1 in this order to constitute a laminate. This laminate is formed a cavity having the cavity length of about 800 μm.

A stripe-like conductive layer 11 is disposed on the p-side semiconductor layer near the center thereof, and the first embedded layer 10 is disposed on an extension of this conductive layer 11 and apart from the conductive layer 11 to the side of both cavity end faces. The conductive layer 11 has the length of about 787 μm, the width of about 7 μm, and the height of about 0.4 μm. The first embedded layers 10 have the length of about 5.0 μm, respectively, the distance D between the conductive layer 11 and the first embedded layers is about 1.5 μm, respectively.

Also, the second embedded layer 9 is formed in contact with the p-side semiconductor layer so as to embed the conductive layer 11 and the first embedded layer 10. Part of the second embedded layer 9 is disposed in between the conductive layer 11 and the first embedded layer 10, separating the two.

The p-side pad electrode 12, which is electrically connected to the conductive layer 11, is formed on the conductive layer 11 and the second embedded layer 9. In this example, neither of the side faces of the p-side pad electrode 12 is in plane with a side face corresponding to the laminate, but may be in plane.

An n electrode 13 is formed on the rear face of the substrate 1.

The method for manufacturing this semiconductor laser element will now be discussed.

First, the semiconductor laminate 14 is formed in the same manner as in Example 1.

Figure 11A:
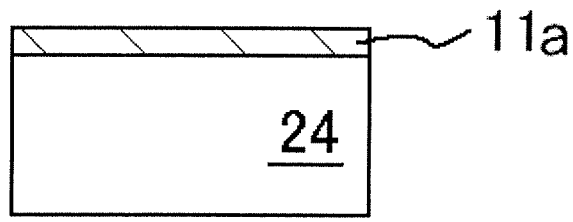
FIGS. 11a-11c include schematic cross-sectional views, and FIGS. 11b' and 11c' include plan views showing a manufacturing still another semiconductor laser element according to the present invention.

As shown in FIG. 11a, a conductive oxide layer 11a composed of ITO is formed in the thickness of 0.4 μm by sputtering on the semiconductor laminate 14 formed as above.

After this, a stripe-like photoresist (having a stripe width of about 7 μm; a stripe with a length of 787 μm located in the center of the cavity, and a stripe with a length of 5 μm provided 1.5 μm away from the first stripe and up to the cavity end face on both sides) is formed on the conductive oxide layer 11a. Using this photoresist as a mask, the conductive oxide layer 11a exposed from the photoresist is removed by reactive ion etching (RIE) using hydrogen iodide gas, for example.

Figure 11B:
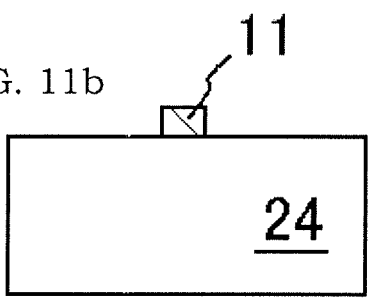
Figure 11B:
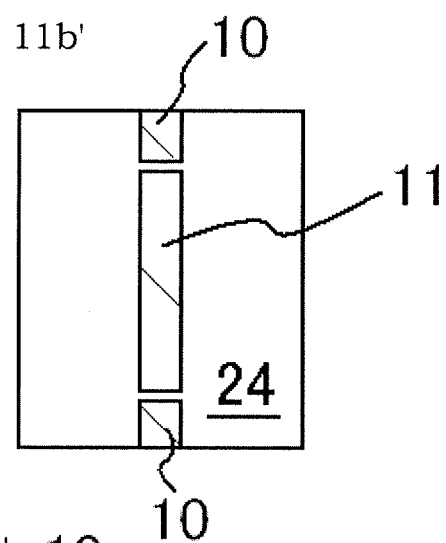

As a result, as shown in FIGS. 11b and 11b', the stripe-like conductive layer 11 and first embedded layer 10 are formed.

Without removing this photoresist, a second embedded layer 9 (refractive index: about 1.5) composed of $SiO_2$ is formed in a thickness of about 400 nm by sputtering on the exposed semiconductor layer and photoresist. A side face protective film can also be formed at the same time.

After this, the photoresist and the second embedded layer 9 formed over it are removed.

Figure 11C:
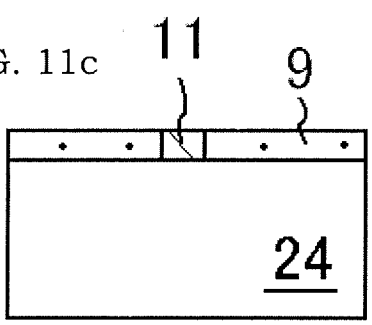
Figure 11C:
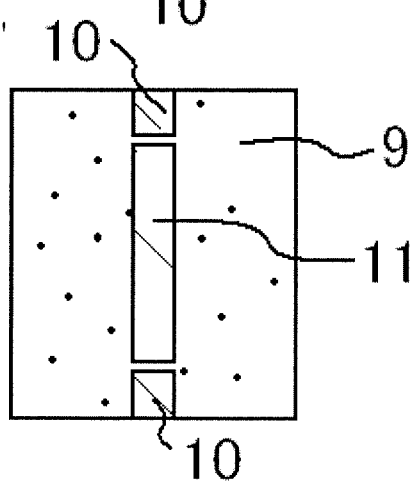
Figure 12A:
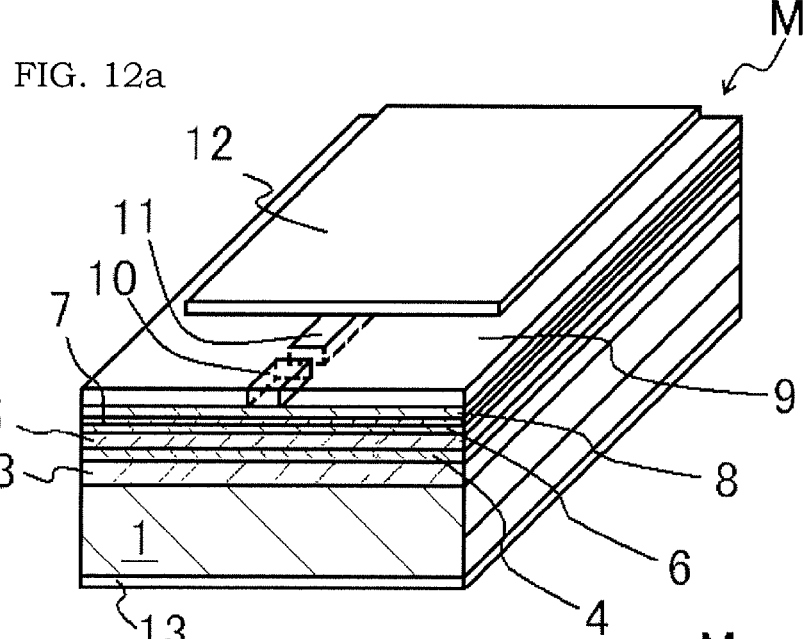
FIG. 12a is a perspective view.
Figure 12B:
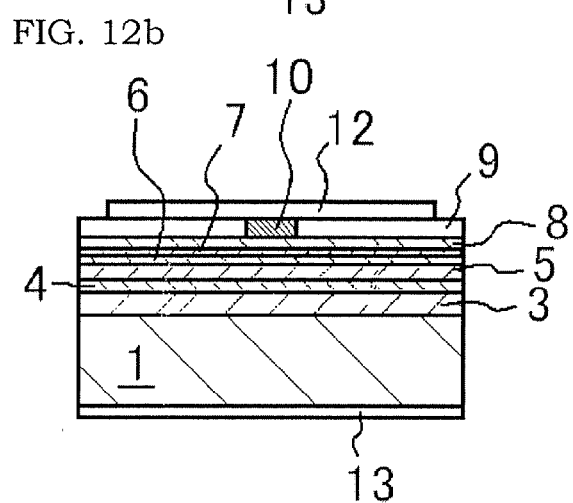
FIG. 12b is a front view.
Figure 12C:
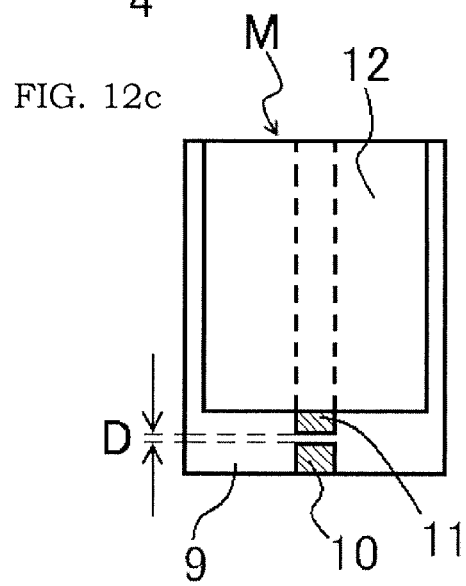
FIG. 12c is a plan view and FIG. 12d is a side view showing the construction of still another semiconductor laser element according to the present invention.
Figure 12D:
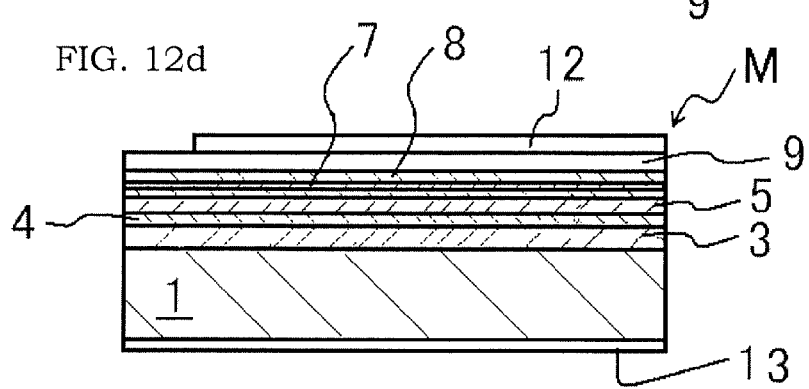

Consequently, as shown in FIGS. 11c and 11c', the second embedded layer 9 is formed so as to surround the conductive layer 11 and the first embedded layer 10.

Annealing is performed to reduce the contact resistance of the p-side semiconductor layer.

The p-side pad electrode 12 is formed on the conductive oxide layer 11.

Also, the rear face of the substrate 1 is grounded, and an n electrode 13 is formed on the rear face of the ground n-type GaN substrate 1.

After this, the wafer is cleaved in a direction perpendicular to the cavity direction to create a bar, and a cavity plane is produced at this cleavage plane.

Then, a dielectric film is formed as an end face protective film at the cavity plane. On the light emission side, $Al_2O_3$ was formed in a film thickness of 70 nm. On the light reflection side, a multilayer dielectric film was formed from a laminate of $ZrO_2$ and $SiO_2$ (total film thickness of 700 nm).

Finally, the product was separated parallel to the cavity plane to make the bar-shaped wafer into a chip, and obtain a semiconductor laser element.

With the semiconductor laser elements of this Example, because the first embedded layer was disposed near the cavity end face separately from the conductive layer, there were no problems such as cleavage or peeling of the conductive oxide layer near the cavity end face, and adhesion with the conductive oxide layer by the end face can be improved, so light can be confined more reliably. Thus, distortion of the laser beam emitted from the cavity end face is prevented, and a good FFP can be obtained.

Also, the flow of current to the cavity end face can be kept to a minimum, the generation of heat at the cavity end face is suppressed, and the COD level can be improved.

Particularly, with the semiconductor laser element of Example 14, as shown in FIGS. 11b and 11b', the conductive layer and the first embedded layer can be formed at the same time by RIE, so it is easy to control the shape and layout of the conductive oxide layer, and this in turn allows the COD level to be raised.

The service life is also extended.

With the semiconductor laser element of Example 14, if no first embedded layer is formed, an abrupt change in the light confinement coefficient near the cavity plane is seen to cause disturbance in the FFP intensity distribution in the vertical direction, and it is confirmed that it is very difficult to drive the laser element for an extended period.

Also, if no first embedded layer is formed and the conductive layer is disposed from one end face of the cavity to the other, electrical conduction near the end face leads to end face deterioration, the COD level is lower than in other cases, and it is confirmed that it is very difficult to drive the laser element for an extended period.

Example 15

As shown in FIGS. 12a to 12d, this semiconductor laser element has substantially the same constitution as the laser element in Example 14, except that the conductive layer 11 is formed in a length of about 793.5 µm, the one end face of the conductive layer 11 is coincide with the cavity end face M of the light reflective side.

Example 16

As shown in FIG. 13a, the second embedded layer 9 (refractive index: about 1.5) composed of $SiO_2$ is formed in a thickness of about 500 nm by CVD on a laminate 14 formed in the same manner as in Example 14.

Then, a photoresist having a stripe-like opening (with a stripe width of about 7 µm; on one end face side, a stripe with a length of 5 µm from this end face, and next to and apart from this a stripe with a length of about 787 µm) is formed on the second embedded layer 9. Using this photoresist as a mask, part of the second embedded layer 9 is selectively removed, and two independent grooves 15 and 16 are formed as shown in FIGS. 13b and 13b'. These grooves 15 and 16 are formed so that their bottom parts reach the semiconductor layer, and so that they are open at the cavity end face. After this, the photoresist is removed.

Dry etching may be used instead of wet etching. Using dry etching makes it easier to control the stripe width and so forth, but it may also damage the surface of the laminate 14, so these factors should be considered in selecting the most appropriate etching method.

A conductive oxide layer (a refractive index: about 2.0) composed of ITO is formed on the entire surface of the second embedded layer 9 including the grooves 15 and 16. On this is formed a photoresist having a pattern that corresponds to the grooves 15 and 16, and this photoresist is used as a mask to perform etching, and to embed the conductive layer 11 and the first embedded layer 10 so that they are electrically separated within the groove 16 near the cavity end face corresponding to the light emission side and the groove 15 near the cavity end face corresponding to the light reflection side, respectively (see FIGS. 13c and 13c').

Then, the mask is removed, and as shown in FIGS. 13d and 13d', a conductive oxide layer 11a composed of ITO is formed on the entire surface of the wafer on which the second embedded layer 9, the conductive layer 11, and the first embedded layer 10 have been formed.

On this is formed a patterned photoresist at part of the conductive layer 11 and the second embedded layer 9, and this photoresist is used as a mask in etching to pattern the conductive layer 11 at part of the groove 15 and partly on the second embedded layer 9 (see FIG. 13e'). This patterned conductive oxide layer 11 can function as an ohmic electrode.

From this point on, a semiconductor laser element was formed in the same manner as in Example 14.

As a result, the same effect is provided as in Example 14.

Example 17

With the semiconductor laser element in this example, the conductive layer is formed in a length of 777 µm, the first embedded layer 10 is formed at a length of 10 µm from the cavity end face on the first embedded layer side, the second embedded layer is formed at 1.5 µm, and the exposed semiconductor layer is embedded from the end face of the conductive layer to the cavity end face.

Other than this, a semiconductor laser element was formed in the same manner as in Example 14.

As a result, the same effect is provided as in Example 14.

Example 18

With the semiconductor laser element in this example, the conductive layer is formed in a length of 784 µm, the first embedded layer 10 is formed at a length of 5 µm from the cavity end face on the first embedded layer side, the second embedded layer is formed about µm 3 away, and the exposed semiconductor layer is embedded from the end face of the conductive layer to the cavity end face.

Other than this, a semiconductor laser element was formed in the same manner as in Example 14.

As a result, the same effect is provided as in Example 14.

Example 19

With the semiconductor laser element of this example, a semiconductor laser element is formed in the same manner as in Example 14, except that the stripe width of the conductive layers 11 and the first embedded layer 10 was changed to 10 µm.

With the semiconductor laser element of this example, in addition to providing the same effects as in Example 14, the output can be increased by widening the groove.

That is, when the output of a laser element is raised, more heat is generally produced, but thus widening the groove reduces the amount of heat generated at the cavity end face where heat generation is particularly pronounced, and allows a comparable COD level and service life characteristics to be obtained.

Example 20

In the semiconductor laser element of this example, a laminate is formed according to Example 14, and a semiconductor laser element is formed in the same manner as in Example 14, except that it has the constitution of its semiconductor layers as shown in Table 2 changing the oscillation wavelength of the laser element to about 440 to 450 nm.

With the semiconductor laser element of this example, the same effect is provided as in Example 14.

The present invention is available in the preparing method for not only a laser element, but also a light emitting element such as light emitting diode (LED).

Description of the Numerals

1: substrate; 3: n-type clad layer; 4: n-side light guide layer; 5: active layer; 6: cap layer; 7: p-side light guide layer; 8: p-type contact layer; 9: second embedded layer; 10: first embedded layer; 11: conductive layer; 11a, 11b: conductive oxide layer; 12: p pad electrode; 13: n electrode; 14, 24: laminate; 15, 25: groove; and 22: n pad electrode.

The invention claimed is:

1. A semiconductor laser element comprising:
a laminate composed of a first conductivity type semiconductor layer, an active layer, and a second conductivity type semiconductor layer;
an insulation layer that is in contact with the second conductivity type semiconductor layer, has a groove formed therein that extends from one end of the laminate to an opposite end of the laminate, the groove having a first section adjacent to the one end of the laminate and a second section extending from the first section toward the opposite end of the laminate, the insulation layer being composed of an insulator;
a first embedded layer embedded within the first section of the groove of the insulation layer, the first embedded layer having a refractive index that is equal to or greater than a refractive index of the insulation layer, the first embedded layer being composed of a dielectric; and
a conductive oxide layer having a first portion laminated on the insulation layer and a second portion embedded within the second section of the groove of the insulation layer such that an end face of the second portion of the conductive oxide layer contacts an end face of the first embedded layer within the groove of the insulation layer.

2. The semiconductor laser element according to claim 1, wherein the first conductivity type semiconductor layer and the second conductivity type semiconductor layer are nitride semiconductor layers.

3. The semiconductor laser element according to claim 1, wherein the first embedded layer has a refractive index that is less than a refractive index of the active layer.

4. The semiconductor laser element according to claim 1, wherein the conductive oxide layer has a refractive index that is greater than the refractive index of the insulation layer, and/or that is less than the refractive index of the active layer.

5. The semiconductor laser element according to claim 1, wherein the first embedded layer is formed from a material selected from a group consisting of $ZrO_2$, $SiO_2$, $Al_2O_3$, $Nb_2O_3$, $TiO_2$, $Ta_2O_3$, AlN and SiN.

6. The semiconductor laser element according to claim 1, wherein the first embedded layer has the refractive index within a range of ±1 of the refractive index of the conductive oxide layer.

7. The semiconductor laser element according to claim 1, wherein the insulation layer is composed of a material whose refractive index is lower than that of the active layer and the conductive oxide layer.

8. The semiconductor laser element according to claim 1, further having another insulation layer that is in contact with the first conductivity type semiconductor layer, and has a second groove, a part of the second groove being embedded with another first embedded layer, and a portion of the second groove being embedded with another conductive layer.

9. The semiconductor laser element according to claim 1, wherein the insulation layer is formed from a material selected from a group consisting of $SiO_2$, $Ga_2O_3$, $Al_2O_3$, $ZrO_2$, SiN, AlN and AlGaN.

10. The semiconductor laser element according to claim 1, wherein an oscillation wavelength is 440 nm or more.

11. A semiconductor laser element comprising:
a laminate composed of a first conductivity type semiconductor layer, an active layer, and a second conductivity type semiconductor layer, and equipped with a cavity;
a stripe-like conductive oxide layer provided in contact on the second conductivity type semiconductor layer; and
a first embedded layer that is in contact on the second conductivity type semiconductor layer, is disposed on an extension line of a longitudinal axis of the conductive oxide layer, and has a refractive index that is less than or equal to a refractive index of the conductive oxide layer, the first embedded layer being spaced apart from the conductive oxide layer in a direction of the longitudinal axis.

12. The semiconductor laser element according to claim 11, further having a second embedded layer that is in contact on the second conductivity type semiconductor layer, is disposed on both sides along the conductive oxide layer, and is formed from an insulating material.

13. The semiconductor laser element according to claim 12, wherein the second embedded layer is formed from a material selected from a group consisting of $SiO_2$, $Ga_2O_3$, $Al_2O_3$, $ZrO_2$, SiN, AlN and AlGaN.

14. The semiconductor laser element according to claim 11, wherein the conductive oxide layer and the first embedded layer are formed from the same material, and a second embedded layer formed from an insulating material is disposed between the conductive oxide layer and the first embedded layer.

15. The semiconductor laser element according to claim 11, wherein the first embedded layer has a different refractive index from that of the conductive oxide layer, is in contact with the conductive oxide layer, and is disposed adjacent to the cavity end face.

16. The semiconductor laser element according to claim 11, wherein one end face of the first embedded layer is formed up to the cavity end face.

17. The semiconductor laser element according to claim 11, wherein the conductive oxide layer and the first embedded layer have a refractive index that is greater than the refractive index of the second embedded layer, and that is less than the refractive index of the active layer.

18. The semiconductor laser element according to claim 11, wherein an oscillation wavelength is 440 nm or more.

19. A semiconductor laser element comprising:
a laminate composed of a first conductivity type semiconductor layer, an active layer, and a second conductivity type semiconductor layer;
an insulation layer that is in contact with the second conductivity type semiconductor layer and is formed with a groove having a first overall length, with side walls of the groove being spaced apart from one another defining an overall width of the groove, the insulation layer being composed of an insulator;
a first embedded layer embedded at one end of the groove of the insulation layer between the side walls of the groove, the first embedded layer having a refractive index that is equal to or greater than a refractive index of the insulation layer, the first embedded layer being composed of a dielectric; and a conductive oxide layer embedded within a portion of the groove of the insulation layer, the conductive oxide layer being formed directly on the second conductivity type semiconductor layer, of the conductive oxide layer defining a second overall length with the first overall length and the second overall length being measured parallel to one another, the first overall length being greater than the second overall length.

20. The semiconductor laser element according to claim 19, wherein the first conductivity type semiconductor layer and the second conductivity type semiconductor layer are nitride semiconductor layers.

21. The semiconductor laser element according to claim 19, wherein the conductive oxide layer has a refractive index that is greater than the refractive index of the insulation layer, and/or that is less than the refractive index of the active layer.

22. The semiconductor laser element according to claim 19, further comprising an electrode in electrical contact with the conductive oxide layer and covering a portion of the conductive oxide layer and a portion of a surface of the insulation layer, with the electrode being spaced apart from the first embedded layer.

23. The semiconductor laser element according to claim 22, further comprising the electrode has a third overall length measured substantially parallel to the cavity direction, the third overall length being less that both the first overall length and the second overall length.

24. A semiconductor laser element comprising:

a laminate composed of a first conductivity type semiconductor layer, an active layer, and a second conductivity type semiconductor layer;

an insulation layer that is in contact with the second conductivity type semiconductor layer, has a groove extending from one end of the laminate to an opposite end of the laminate, the insulation layer being composed of an insulator;

a first embedded layer embedded at one end of the groove of the insulation layer, the first embedded layer having a refractive index that is equal to or greater than a refractive index of the insulation layer, the first embedded layer being composed of a dielectric;

a conductive oxide layer laminated on the insulation layer and embedded within a portion of the groove, with conductive oxide layer having a first overall length measured in a lengthwise direction of the groove; and an electrode in electrical contact with the conductive oxide layer located outside the cavity and extending along a surface of the insulation layer, the electrode having a second overall length that is less than the first overall length with the electrode being spaced apart from the first embedded layer.

25. The semiconductor laser element according to claim 24, wherein an end face of the conductive layer within the groove is spaced apart from an end face of the first embedded layer within the groove.

26. A semiconductor laser element comprising:

a laminate composed of a first conductivity type semiconductor layer, an active layer, and a second conductivity type semiconductor layer;

an insulation layer that is in contact with the second conductivity type semiconductor layer, has a groove formed therein that extends from one end of the laminate to an opposite end of the laminate, the groove having a first section adjacent to the one end of the laminate and a second section extending from the first section toward the opposite end of the laminate, the insulation layer being composed of an insulator;

a first embedded layer embedded within the first section of the groove of the insulation layer, the first embedded layer having a refractive index that is equal to or greater than a refractive index of the insulation layer, the first embedded layer being composed of a dielectric; and a conductive oxide layer embedded within the second section of the groove of the insulation layer such that an end face of the conductive oxide layer contacts an end face of the first embedded layer within the groove of the insulation layer.

* * * * *